United States Patent
Sakai et al.

(10) Patent No.: US 10,672,554 B2
(45) Date of Patent: Jun. 2, 2020

(54) INDUCTOR COMPONENT AND METHOD FOR MANUFACTURING THE SAME

(71) Applicant: Murata Manufacturing Co., Ltd., Kyoto (JP)

(72) Inventors: Norio Sakai, Kyoto (JP); Yoshihito Otsubo, Kyoto (JP); Hideaki Hashi, Kyoto (JP); Takayuki Tange, Kyoto (JP); Munetake Miyashita, Kyoto (JP); Takeshi Wake, Kyoto (JP); Yasuhiro Higashide, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/046,092

(22) Filed: Jul. 26, 2018

(65) Prior Publication Data

US 2018/0330870 A1   Nov. 15, 2018

Related U.S. Application Data

(63) Continuation of application No. PCT/JP2017/002508, filed on Jan. 25, 2017.

(30) Foreign Application Priority Data

Jan. 27, 2016  (JP) .................................. 2016-013183
Mar. 16, 2016  (JP) .................................. 2016-051918

(51) Int. Cl.
*H01F 27/00* (2006.01)
*H01F 27/29* (2006.01)
(Continued)

(52) U.S. Cl.
CPC ......... *H01F 27/29* (2013.01); *H01F 17/0013* (2013.01); *H01F 17/0033* (2013.01);
(Continued)

(58) Field of Classification Search
CPC .......... H01F 27/29; H01F 27/28; H01F 41/04; H01F 17/0013; H01F 17/0033;
(Continued)

(56) References Cited

U.S. PATENT DOCUMENTS 5,612,660 A * 3/1997 Takimoto ............ H01F 17/0013
336/200
5,909,050 A * 6/1999 Furey ............... G06K 19/07749
152/152.1

(Continued)

FOREIGN PATENT DOCUMENTS

CN  103971892 A  8/2014
JP  H04-070724 U  6/1992
(Continued)

OTHER PUBLICATIONS

International Search Report for International Application No. PCT/JP2017/002508, dated Apr. 4, 2017.
(Continued)

*Primary Examiner* — Pete T Lee
(74) *Attorney, Agent, or Firm* — Pearne & Gordon LLP

(57) ABSTRACT

An inductor component 1a includes a resin layer 3 and an inductor electrode 6. The inductor electrode 6 includes metal pins 7a to 7d that extend in the resin layer 3 with upper end surfaces thereof exposed from the upper surface 3a of the resin layer 3, and upper wiring plates 8a and 8b that are disposed on the upper surface 3a of the resin layer 3 and that connect upper end surfaces of the short metal pins 7a and 7c and upper end surfaces of the long metal pins 7b and 7d to each other. In this case, the inductor electrode 6 is formed of the metal pins 7a to 7d and wiring plates 8a to 8c that each have a specific electrical resistance lower than that of a conductive paste and plating, and the resistance of the entire inductor electrode 6 can be decreased.

18 Claims, 20 Drawing Sheets

(51) Int. Cl.
| | |
|---|---|
| *H01F 41/10* | (2006.01) |
| *H01F 17/04* | (2006.01) |
| *H05K 3/28* | (2006.01) |
| *H01F 27/28* | (2006.01) |
| *H01F 41/04* | (2006.01) |
| *H01F 17/00* | (2006.01) |
| *H01F 27/24* | (2006.01) |
| *H01F 27/32* | (2006.01) |
| *H01F 41/02* | (2006.01) |
| *H05K 1/11* | (2006.01) |
| *H05K 1/18* | (2006.01) |
| *H01F 27/02* | (2006.01) |

(52) U.S. Cl.
CPC ............ *H01F 17/04* (2013.01); *H01F 27/24* (2013.01); *H01F 27/2847* (2013.01); *H01F 27/2852* (2013.01); *H01F 27/327* (2013.01); *H01F 41/02* (2013.01); *H01F 41/043* (2013.01); *H01F 41/10* (2013.01); *H05K 1/115* (2013.01); *H05K 1/185* (2013.01); *H05K 3/284* (2013.01); *H01F 27/022* (2013.01); *H01F 2017/002* (2013.01); *H05K 2201/086* (2013.01); *H05K 2201/1003* (2013.01); *H05K 2201/1028* (2013.01); *H05K 2201/10318* (2013.01); *H05K 2201/10378* (2013.01); *H05K 2203/1316* (2013.01)

(58) Field of Classification Search
CPC ...... H01F 17/04; H01F 27/24; H01F 27/2847; H01F 27/2852; H01F 27/327; H01F 41/02; H01F 41/043; H01F 41/10; H01F 27/022; H01F 2017/002; H05K 1/185; H05K 3/30; H05K 2201/1003; H05K 2203/13; H05K 1/115; H05K 3/284; H05K 2201/086; H05K 2201/1028; H05K 2201/10318; H05K 2201/10378; H05K 2203/1316

See application file for complete search history.

(56) References Cited

U.S. PATENT DOCUMENTS

| | | | |
|---|---|---|---|
| 7,109,838 B2* | 9/2006 | Brennan | H01F 17/0033 257/E21.022 |
| 8,405,482 B2* | 3/2013 | Cho | H01L 23/5225 257/531 |
| 8,803,648 B2* | 8/2014 | Lo | H01F 27/2804 336/182 |
| 9,190,204 B1* | 11/2015 | Cates, Jr. | H01F 27/2804 |
| 9,472,528 B2* | 10/2016 | Yap | H01L 25/16 |
| 2007/0090912 A1* | 4/2007 | Lee | H01F 17/0013 336/200 |
| 2011/0228507 A1 | 9/2011 | Yin et al. | |
| 2012/0228755 A1* | 9/2012 | Nagano | H01L 23/04 257/698 |
| 2014/0218147 A1 | 8/2014 | Chatani et al. | |

FOREIGN PATENT DOCUMENTS

| | | |
|---|---|---|
| JP | H08-162329 A | 6/1996 |
| JP | H08-273936 A | 10/1996 |
| JP | 2000-40620 A | 8/2001 |
| JP | 2011-193000 A | 9/2011 |
| JP | 2013-175564 A | 9/2013 |
| JP | 5474251 B1 | 4/2014 |

OTHER PUBLICATIONS

Written Opinion for International Application No. PCT/JP2017/002508, dated Apr. 4, 2017.

\* cited by examiner

FIG. 1
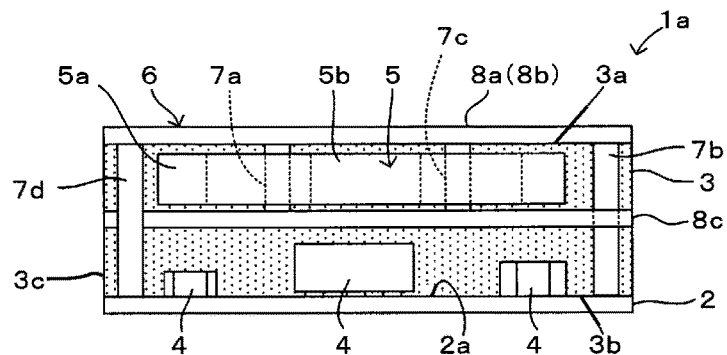
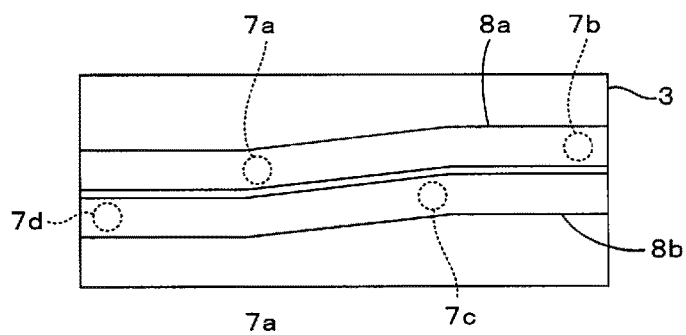
FIG. 2A
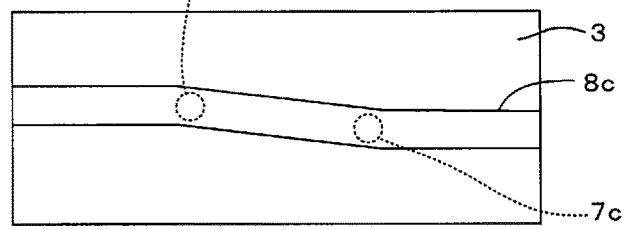
FIG. 2B
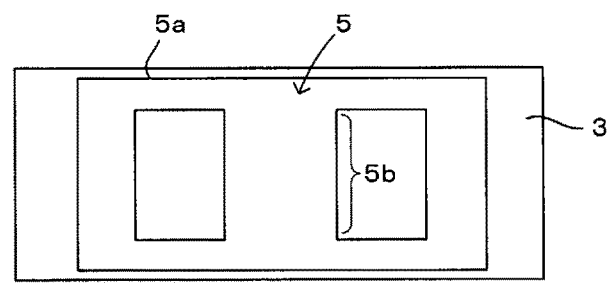
FIG. 2C
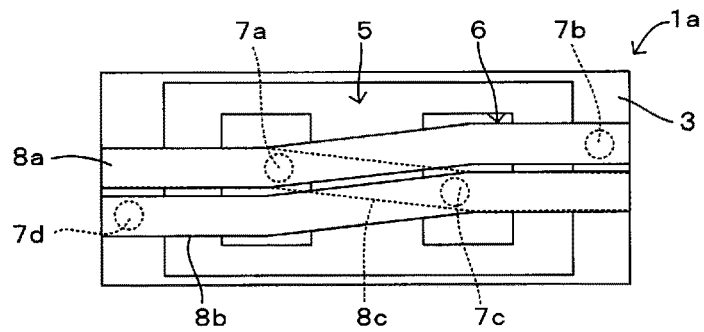
FIG. 2D

US 10,672,554 B2

INDUCTOR COMPONENT AND METHOD FOR MANUFACTURING THE SAME

This is a continuation of International Application No. PCT/JP2017/002508 filed on Jan. 25, 2017 which claims priority from Japanese Patent Application No. 2016-051918 filed on Mar. 16, 2016 and from Japanese Patent Application No. 2016-013183 filed on Jan. 27, 2016. The contents of these applications are incorporated herein by reference in their entireties.

BACKGROUND OF THE DISCLOSURE

Field of the Disclosure

The present disclosure relates to an inductor component including a resin layer and an inductor electrode, and a method for manufacturing the inductor component.

Description of the Related Art

As illustrated in FIG. 34, a known inductor component 100 includes a coil 102 disposed on a core substrate 101 formed of a printed circuit board or a prepreg (see, for example, Patent Document 1). In this case, an annular magnetic-material layer 103 is disposed inside the core substrate 101, and the coil 102 is spirally wound around the magnetic-material layer 103. The coil 102 includes inner interlayer connection conductors 102a arranged along the inner circumference of the magnetic-material layer 103, outer interlayer connection conductors 102b arranged along the outer circumference of the magnetic-material layer 103 such that the outer interlayer connection conductors 102b are paired with the interlayer connection conductors 102a, upper wiring patterns 102c that connect upper ends of the inner interlayer connection conductors 102a to upper ends of the corresponding outer interlayer connection conductors 102b, and lower wiring patterns 102d that connect lower ends of the inner interlayer connection conductor and lower ends of the corresponding outer interlayer connection conductor 102b. Each of the interlayer connection conductors 102a and 102b is formed of a through-hole conductor obtained by forming a conductor film on the inner surface of a through-hole extending through the core substrate 101. Each of the wiring patterns 102c and 102d is formed of a print pattern by using a conductive paste.

Patent Document 1: Japanese Unexamined Patent Application Publication No. 2000-40620 (see, for example, paragraph 0018, and FIG. 1)

BRIEF SUMMARY OF THE DISCLOSURE

In recent years, electronic devices have decreased size and high functionality, and there is a need for a technique of improving the characteristics of inductor components with which the electronic devices are equipped. One of the methods of improving the characteristics of the inductor components is to decrease the resistance value of inductor electrodes (in the case of the inductor component 100, the coil 102). In the existing inductor component 100, however, each of the interlayer connection conductors 102a and 102b that the coil 102 includes is formed of the through-hole conductor obtained by forming the conductor film on the inner surface of the through-hole. Accordingly, there is a limitation on the decrease in the connection resistance of the upper wiring patterns 102c and the lower wiring patterns 102d. In the case where the through-hole is filled with a conductive paste to form a via conductor, the connection resistance can be decreased. The conductive paste, however, is typically formed in a manner in which a metal filler is mixed with, for example, an organic solvent, and, in this case, has a specific electrical resistance higher than that of a pure metal. Each of the wiring patterns 102c and 102d is also formed of a conductive paste, and it is difficult to decrease the resistance of the entire inductor electrode.

The present disclosure has been accomplished in view of the above problems, and it is an object of the present disclosure to improve the characteristics of an inductor component including a resin layer and an inductor electrode in a manner in which the resistance of the inductor electrode is decreased.

To achieve the above object, an inductor component according to the present disclosure includes a resin layer, and an inductor electrode. The inductor electrode includes a first metal pin and a second metal pin that extend in the resin layer with a first end of the first metal pin and a first end of the second metal pin exposed from one main surface of the resin layer, and a first metal plate that is disposed on the one main surface of the resin layer and that is in contact with the first end of the first metal pin and the first end of the second metal pin.

With this structure, the inductor electrode includes the first and second metal pins and the first metal plate that each have a specific electrical resistance lower than that of a conductive paste and plating, and the resistance of the entire inductor electrode can be decreased. Consequently, the characteristics (for example, an inductance value) of the inductor component can be improved.

The second metal pin may be longer than the first metal pin. With this structure, the use of the lengths of the second metal pin and the first metal pin enables the degree of freedom of a design of the inside of the resin layer to be improved, for example, such that a region of the resin layer near the one main surface is used as a region in which the inductor electrode is formed, and a region of the resin layer near the other main surface is used as a region in which a component is disposed.

The inductor component may further include a circuit board a main surface of which is in contact with the other main surface of the resin layer, and the component that is mounted on the main surface of the circuit board and that is sealed in the resin layer. The inductor electrode may further include a second metal plate that is disposed inside the resin layer and that is connected to a second end of the first metal pin. A second end of the second metal pin may be exposed from the other main surface of the resin layer and is connected to the circuit board.

With this structure, for example, in the case where an outer electrode is formed on a back surface of the circuit board opposite the main surface, and the inductor component is mounted on a mother substrate, the component can be disposed near the mother substrate, and the heat dissipation when the component generates heat can be improved. The size of the inductor component can be decreased in a manner in which the component is disposed between the main surface of the circuit board and the second metal plate.

The second metal plate may include a first bent portion formed such that a portion thereof is bent in a direction perpendicular to the one main surface of the resin layer, and a first insertion hole through which the second end of the first metal pin is inserted may be formed in the second metal plate at the first bent portion.

With this structure, the contact area between the second metal plate and the first metal pin can be readily increased in a manner in which the portion of the second metal plate that is bent in a direction perpendicular to the one main surface of the resin layer is brought into contact with a side surface of the first metal pin.

A second end portion including the second end of the first metal pin may be thinner than the other portion of the first metal pin. The second end portion of the first metal pin may be inserted through a second insertion hole that is formed in the second metal plate, that is smaller than the other portion of the first metal pin, and that is larger than the second end portion.

With this structure, the likelihood of proper alignment when the second end portion of the first metal pin is inserted through the second insertion hole can be ensured. Since the second insertion hole is smaller than the other portion of the first metal pin, the second metal plate and the first metal pin can be connected to each other with certainty.

The inductor electrode may further include a third metal pin that is shorter than the second metal pin and that extends in the resin layer with a first end of the third metal pin exposed from the one main surface of the resin layer, and a third metal plate that is disposed on the one main surface of the resin layer and that is connected to the first end of the third metal pin. The second metal plate may connect the second end of the first metal pin and a second end of the third metal pin to each other such that the inductor electrode forms a coil having a winding axis in a direction substantially parallel to the one main surface of the resin layer.

With this structure, a three-dimensional coil extending in both directions of the main surface and the thickness of the resin layer can be formed. In addition, a component can be disposed between the main surface of the circuit board and the second metal plate. In this case, the heat dissipation characteristics of the component can be readily ensured and the size of the inductor component can be readily decreased concurrently.

At least an end of the first metal plate may reach an edge portion of the resin layer when viewed from a direction perpendicular to the one main surface of the resin layer.

With this structure, a metallic portion of the inductor component is increased, and the heat dissipation characteristics of the inductor component can be improved. In addition, in the case where a part of an edge of the second metal plate reaches the periphery of the resin layer, the part of the second metal plate is exposed from the resin layer, and the heat generated from the inductor component is likely to dissipate.

The inductor component may further include a coil core that is disposed between the first metal pin and the third metal pin and between the first metal plate and the second metal plate. With this structure, the inductance value of the inductor electrode can be effectively increased.

The coil core may have a shape obtained from a combination of an annular portion and a rod-like portion disposed such that the rod-like portion halves an inner region of the annular portion when viewed from a direction perpendicular to the one main surface of the resin layer. The rod-like portion may be disposed between the first metal pin and the third metal pin such that an axial direction of the rod-like portion is substantially parallel to the winding axis of the coil.

With this structure, the coil core is disposed on a path through which the lines of the magnetic flux occurring when the inductor electrode (coil) is energized pass, and the characteristics (for example, the inductance value) of the inductor electrode can be improved.

Both ends of the first metal plate may reach edge portions of the resin layer when viewed from a direction perpendicular to the one main surface of the resin layer. A portion of the first metal plate that is located between a contact with the first metal pin and a contact with the third metal pin may have a width larger than a width of the other portion of the first metal plate.

With this structure, the width of a wiring line between the first metal pin and the third metal pin can be increased, and the connection resistance between the metal pins can be decreased.

The first metal plate may include a second bent portion formed such that a portion thereof is bent in a direction perpendicular to the one main surface of the resin layer, and a third bent portion formed such that another portion thereof is bent in the direction perpendicular to the one main surface of the resin layer. A third insertion hole through which the first end of the first metal pin is inserted may be formed in the first metal plate at the second bent portion, and a fourth insertion hole through which the first end of the second metal pin is inserted may be formed in the first metal plate at the third bent portion.

With this structure, the area of connect between the first metal plate and the first metal pin and between the first metal plate and the second metal pin can be readily increased in a manner in which the portions (the portion and the other portion) of the first metal plate that are bent in a direction perpendicular to the one main surface of the resin layer are brought into contact with a side surface of the first metal pin and a side surface of the second metal pin.

A fifth insertion hole through which the first metal pin is inserted and a sixth insertion hole through which the second metal pin is inserted may be formed in the first metal plate. A first end portion including the first end of the first metal pin may have a flange shape larger than the fifth insertion hole, and the first end portion may engage the first metal plate. A first end portion including the first end of the second metal pin may have a flange shape larger than the sixth insertion hole, and the first end portion may engage the first metal plate.

With this structure, the contact area between the first metal pin and the first metal plate, and the contact area between the second metal pin and the first metal plate can be adjusted in a manner in which the size of the portion (first end portion) of the first metal pin that has a flange shape and the size of the portion (first end portion) of the second metal pin that has a flange shape are adjusted.

The first metal plate may be a lead frame. This case is practical because the first metal plate can be formed of the lead frame, which is a typical member used for wiring.

The inductor component may further include a substrate that has a first main surface and a second main surface and that includes a component disposed on the first main surface. The first metal plate may be disposed on the substrate. With this structure, components can be mounted on the circuit board and the substrate, and a production area of the inductor component can be reduced.

The inductor component may further include a substrate that has a first main surface and a second main surface and that includes a heat-dissipation member disposed on the first main surface. The first metal plate may be disposed on the substrate. With this structure, the heat-dissipation member improves the heat dissipation characteristics of the inductor component.

A method according to the present disclosure for manufacturing an inductor component includes a step of connecting a first end of a first metal pin and a first end of a second metal pin longer than the first metal pin to a surface of a first metal plate supported by a flat-plate frame to form a first structure in which the metal pins having different lengths are disposed on the surface of the first metal plate, a step of connecting a surface of a second metal plate supported by a flat-plate frame to a second end of the first metal pin to form a second structure in which an inductor electrode including the first metal plate, the second metal plate, the first metal pin, and the second metal pin is formed, a step of connecting a second end of the second metal pin to a main surface of a circuit board including a component mounted on the main surface to form a third structure in which the component is disposed between the main surface of the circuit board and the second metal plate, a step of filling a space between the first metal plate and the main surface of the circuit board with a resin to form a fourth structure including the third structure and a resin layer, and a step of processing the fourth structure such that the flat-plate frame of the first metal plate and the flat-plate frame of the second metal plate are removed.

According to the method, an inductor electrode having a resistance value lower than that of an inductor electrode formed of a conductive paste or plating can be manufactured. Since the second metal pin is longer than the first metal pin, when the second end of the second metal pin is connected to the main surface of the circuit board (third structure), a space in which the component is to be disposed can be formed between a second metal body and the main surface of the circuit board. Since the first metal plate and the second metal plate are supported by the flat-plate frames, it is not necessary for a main surface of the resin layer to be used for a supporting plate unlike an existing method. Accordingly, the third structure can be formed before the formation of the resin layer, and the manufacturing cost of the inductor component can be reduced. There is no need for a plating process or a printing process, which an existing method needs, to form the inductor electrode. Accordingly, the manufacturing cost of the inductor component can be further reduced, and the manufacturing time can be decreased. Since the fourth structure is processed such that the flat-plate frame of the first metal plate and the flat-plate frame of the second metal plate are removed, edges of the first and second metal plates reach the periphery of the resin layer when viewed in a direction perpendicular to the main surfaces of the resin layer, and an inductor component having high heat dissipation characteristics can be manufactured.

The first metal plate and the second metal plate may each have an insertion hole through which the component is inserted.

According to the present disclosure, the inductor electrode includes the first and second metal pins and the first metal plate that each have a specific electrical resistance lower than that of a conductive paste and plating, and the resistance of the entire inductor electrode can be decreased. Consequently, the characteristics (for example, the inductance value) of the inductor component can be improved.

BRIEF DESCRIPTION OF THE SEVERAL
VIEWS OF THE DRAWINGS

FIG. 1 illustrates an inductor component according to a first embodiment of the present disclosure.

FIGS. 2A to 2D illustrate plan views of wiring plates and a coil core in FIG. 1.

DETAILED DESCRIPTION OF THE DISCLOSURE

First Embodiment

Figure 3A:
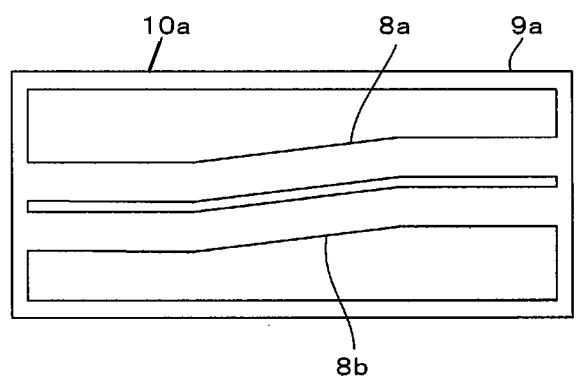
FIGS. 3A and 3B illustrate plan views of the wiring plates supported by frames.

An inductor component according to a first embodiment of the present disclosure will be described with reference to FIG. 1 and FIGS. 2A to 2D. FIG. 1 illustrates the inductor component viewed from a direction parallel to the main surfaces of a circuit board, and an illustration of a part of a resin layer is omitted to see the internal structure. FIG. 2A is a plan view of upper wiring plates. FIG. 2B is a plan view of a lower wiring plate. FIG. 2C is a plan view of a coil core. FIG. 2D is a plan view of the inductor component and illustrates a wiring structure of an inductor electrode.

(Structure of Inductor Component)

An inductor component 1a according to the present embodiment includes a circuit board 2, a resin layer 3 stacked on the upper surface 2a of the circuit board 2, components 4 mounted on the upper surface 2a of the circuit board 2, a coil core 5 disposed inside the resin layer 3, and an inductor electrode 6, and is to be mounted on, for example, a mother substrate of an electronic device such as a mobile terminal device.

Examples of the circuit board 2 include a glass epoxy resin substrate and a ceramic substrate. A via conductor and various wiring electrodes are formed inside the circuit board 2. Connection electrodes (not illustrated) connected to the components 4 and metal pins 7a to 7d described later are formed on the upper surface 2a. The circuit board 2 may have a single-layer structure or a multilayer structure.

For example, each of the components 4 is composed of, for example, a semiconductor element formed of, for example, Si, a chip capacitor, a chip inductor, or a chip resistance.

An upper wiring plate 8a, described later, is disposed on the upper surface 3a (corresponding to "one main surface of the resin layer" according to the present disclosure) of the resin layer 3. The lower surface 3b (corresponding to "the other main surface of the resin layer" according to the present disclosure) of the resin layer 3 is in contact with the upper surface 2a of the circuit board 2. The resin layer 3 and the circuit board 2 according to the present embodiment are oblong when viewed from a direction perpendicular to the upper surface 3a of the resin layer 3 (also referred to below as a plan view). The resin layer 3 can be formed of various materials that are typically used as sealing resins such as epoxy resins.

The coil core 5 is formed of a magnetic material that is used for a typical coil core such as Ni—Zn ferrite. In the case where Mn—Zn ferrite having a low insulating property is used, a member that is coated with, for example, an epoxy resin may be used to ensure the insulating property. As illustrated in FIG. 2C, the coil core 5 according to the present embodiment has a shape obtained from a combination of an annular portion 5a and a rod-like portion 5b disposed such that the rod-like portion halves an inner region of the annular portion 5a in a plan view.

The inductor electrode 6 includes the four metal pins 7a to 7d and three wiring plates 8a, 8b, and 8c, and serves as a coil wound around the rod-like portion 5b of the coil core 5. The metal pins 7a to 7d are classified into two types of two long metal pins and two short metal pins, and the upper end surfaces thereof (each corresponding to a "first end" according to the present disclosure) are exposed from the upper surface 3a of the resin layer 3. As illustrated in FIG. 2D, one of the two short metal pins 7a and 7c is disposed close to one side of the rod-like portion 5b of the coil core 5, and the other is disposed close to the other side of the rod-like portion 5b. One of the two long metal pins 7b and 7d is disposed close to one short side of the resin layer 3 outside the annular portion 5a of the coil core 5, and the other is disposed close to the other short side of the resin layer 3 outside the annular portion 5a of the coil core 5. The two short metal pins 7a and 7c correspond to a "first metal pin" and a "third metal pin" according to the present disclosure. The long metal pins 7b and 7d each correspond to a "second metal pin" according to the present disclosure. Each of the metal pins 7a to 7d can be formed, for example, in a manner in which a metal wire such as a Cu, Al, or Ag wire is sheared.

The two upper wiring plates 8a and 8b are disposed on the upper surface 3a of the resin layer 3. As illustrated in FIG. 2A, the upper wiring plates 8a and 8b each have a linear shape substantially parallel to the longitudinal direction of the oblong resin layer 3 and connect the upper end surfaces of the short metal pins 7a and 7c and the upper end surfaces of the long metal pins 7b and 7d to each other. Specifically, regarding the metal pins 7a to 7d, each of the short metal pins 7a and 7c is paired with a corresponding one of the long metal pins 7b and 7d, and the two upper wiring plates 8a and 8b connect the upper end surfaces of the metal pins 7a to 7d that are paired to each other. According to the present embodiment, each of the short metal pins 7a and 7c is paired with one of the long metal pins 7b and 7d that is located farther from the metal pins 7a and 7c. Each of the upper wiring plates 8a and 8b is formed such that both ends thereof reach the periphery (both short sides of an oblong shape in a plan view) of the resin layer 3.

The lower wiring plate 8c is disposed inside the resin layer 3. As illustrated in FIG. 2B, the lower wiring plate 8c has a linear shape substantially parallel to the longitudinal direction of the oblong resin layer 3 and connect the lower end surfaces of the short metal pins 7a and 7c to each other. The lower wiring plate 8c is formed such that both ends thereof reach the periphery of the resin layer 3 as in the upper wiring plates 8a and 8b, and end portions thereof are exposed from side surfaces 3c of the resin layer 3. The lower end surfaces of the long metal pins 7b and 7d (each corresponding to a "second end of the second metal pin" according to the present disclosure) are exposed from the lower surface 3b (corresponding to the "other main surface of the resin layer" according to the present disclosure) of the resin layer 3 and connected to connection electrodes (not illustrated) on the upper surface 2a of the circuit board 2. With such a connection structure, the two long metal pins 7b and 7d serve as input and output terminals, and the inductor electrode 6 is formed so as to be wound around the rod-like portion 5b of the coil core 5 (see FIG. 2D). In this case, the axial direction (length direction) of the rod-like portion 5b is substantially parallel to the winding axis of the inductor electrode 6. The two upper wiring plates 8a and 8b correspond to a "first metal plate" and a "third metal plate" according to the present disclosure. The lower wiring plate 8c corresponds to a "second metal plate" according to the present disclosure.

In the case where a planar coil pattern is formed on the upper surface 2a of the circuit board 2, the winding axis of a coil is perpendicular to the upper surface 2a of the circuit board 2. In contrast, according to the present embodiment, the wiring structure of the inductor electrode 6 is three-dimensional, and the winding axis of the coil (inductor electrode 6) is parallel to the upper surface 2a of the circuit board 2.

Figure 5:
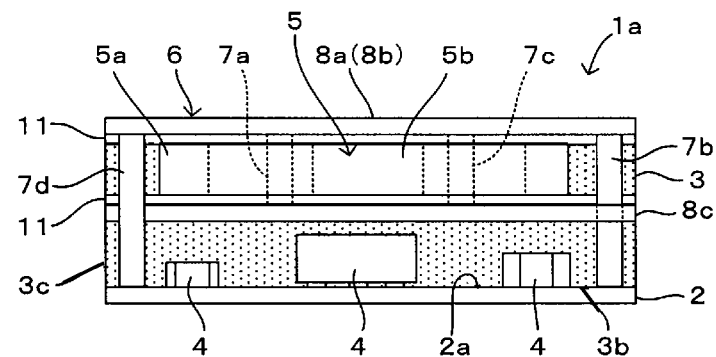
FIG. 5 illustrates a modification to the inductor component.

As illustrated in FIG. 5, insulating films 11 formed of an insulating material such as an epoxy resin, polyimide, or a silicon resin may be disposed between the coil core 5 and the wiring plates 8a to 8c. This enables the coil core 5 and the inductor electrode 6 to be insulated from each other, and the characteristics of the inductor electrode 6 can be stable.

(Method for Manufacturing Inductor Component)

Figure 3B:
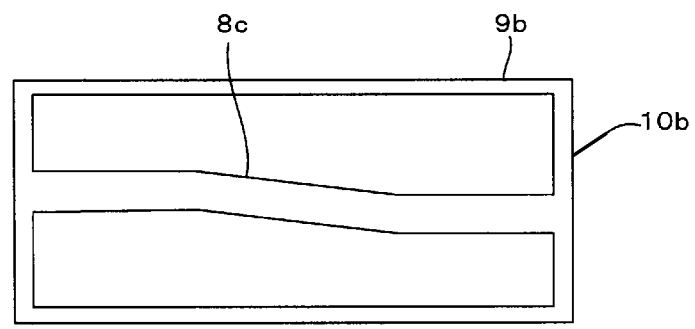

A method for manufacturing the inductor component 1a will now be described with reference to FIGS. 3A and 3B and FIGS. 4A to 4F. FIGS. 3A and 3B illustrate plan views of the wiring plates 8a to 8c supported by frames. FIGS. 4A to 4F illustrate the method for manufacturing the inductor component 1a.

The wiring plates 8a to 8c are first prepared. For example, the two upper wiring plates 8a and 8b can be formed by etching a metal plate formed of, for example, Cu. At this time, regions corresponding to a frame 9a and the upper wiring plates 8a and 8b are left and the other regions are removed by etching to form a first etching plate 10a in which both ends of the upper wiring plates 8a and 8b are supported by the frame 9a. Also, in the case of the lower wiring plate 8c, a second etching plate 10b in which both ends of the lower wiring plate 8c are supported by a frame 9b is formed. The formation of the wiring plates 8a to 8c is not limited to etching. For example, various methods such as a punching process can be used. An example of the etching plate 10a is a lead frame.

Figure 4A:
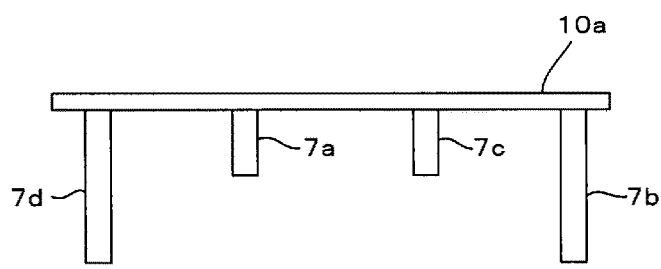
FIGS. 4A to 4F illustrate a method for manufacturing the inductor component in FIG. 1.

Subsequently, as illustrated in FIG. 4A, the upper end surfaces of the metal pins 7a to 7d are connected at predetermined positions to one surface of each of the upper wiring plates 8a and 8b of the first etching plate 10a (FIG. 4A corresponds to a "first structure" according to the present disclosure). Solder joining, ultrasonic joining, and a joining material such as conductive adhesive can be used for the connection.

Figure 4B:
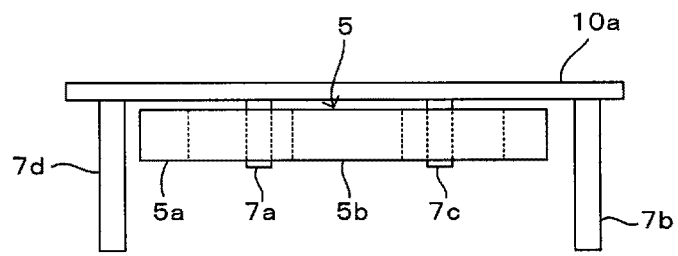

Subsequently, as illustrated in FIG. 4B, the coil core 5 is disposed on the first structure. At this time, the coil core 5 is disposed such that the rod-like portion 5b of the coil core 5 is located between the short metal pins 7a and 7c and the long metal pins 7b and 7d are located outside of the annular portion 5a.

Figure 4C:
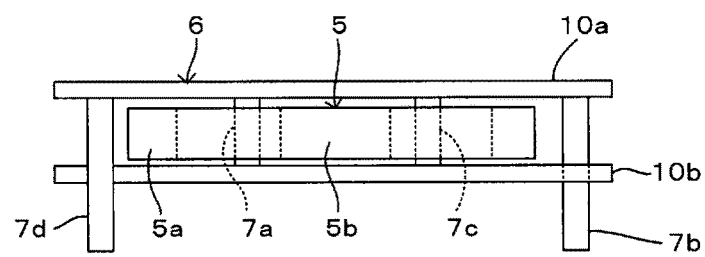

Subsequently, as illustrated in FIG. 4C, the lower end surfaces of the short metal pins 7a and 7c are connected to one surface of the lower wiring plate 8c of the second etching plate 10b to form the inductor electrode 6 (FIG. 4C corresponds to a "second structure" according to the present disclosure). Solder joining, ultrasonic joining, and a joining material such as conductive adhesive can be used also for the connection.

Figure 4D:
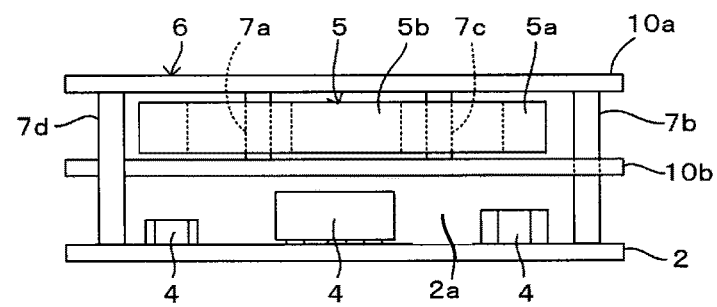

Subsequently, as illustrated in FIG. 4D, after the components 4 are mounted on the upper surface 2a of the circuit board 2 by using a known surface mount technology, the lower end surfaces of the long metal pins 7b and 7d are connected to the upper surface 2a (FIG. 4D corresponds to a "third structure" according to the present disclosure). In this case, the components 4 are located between the second etching plate 10b and the upper surface 2a of the circuit board 2.

Figure 4E:
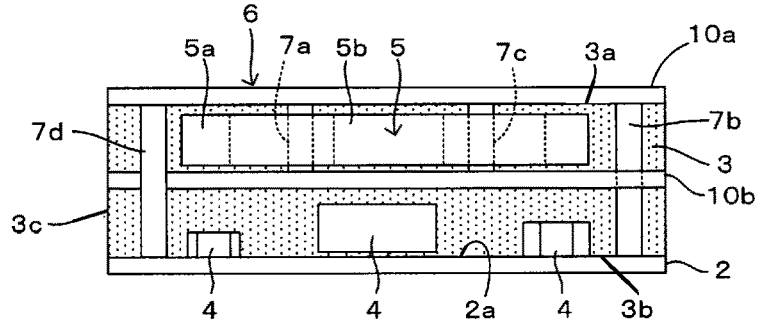

Subsequently, as illustrated in FIG. 4E, a space between the first etching plate 10a and the circuit board 2 is filled with an epoxy resin to form the resin layer 3 that seals the components 4, the coil core 5, and a part of the inductor electrode 6 (FIG. 4E corresponds to a "fourth structure" according to the present disclosure). For example, a dispensing method or a printing method can be used to form the resin layer 3.

Figure 4F:
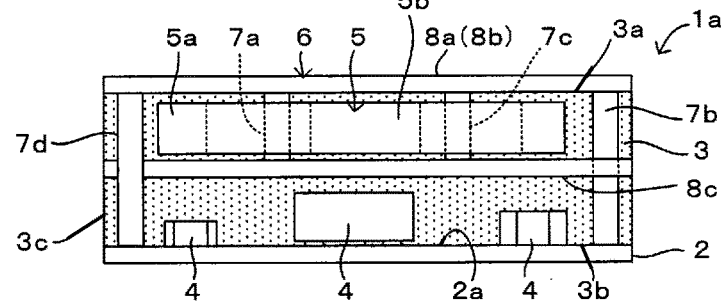

Subsequently, as illustrated in FIG. 4F, the frame 9a of the first etching plate 10a (see FIG. 3A) and the frame 9b of the second etching plate 10b (see FIG. 3B) are removed to complete the inductor component 1a. For example, a dicing process or a laser process can be used to remove the frames 9a and 9b.

According to the above embodiment, the inductor electrode 6 is formed of the metal pins 7a to 7d and the wiring plates 8a to 8c that each have a specific electrical resistance lower than that of a conductive paste and plating, and the resistance of the entire inductor electrode 6 can be decreased. Consequently, the characteristics of the inductor component 1a (for example, an inductance value) can be improved.

The formation of the inductor electrode 6 with the metal pins 7a to 7d having different lengths enables the degree of freedom of a design of the inside of the resin layer 3 to be improved, for example, such that a region of the resin layer 3 near the upper surface 3a is used as a region in which the inductor electrode 6 is formed, and a region of the resin layer 3 near the lower surface is used as a region in which the components are disposed. The arrangement of the components 4 between the upper surface 2a of the circuit board 2 and the lower wiring plate 8c enables the size of the inductor component 1a to be decreased. For example, in the case where the coil is formed of only a wiring electrode formed on the upper surface 2a of the circuit board 2, it is difficult to decrease the area of the upper surface 2a of the circuit board 2. However, the formation of the inductor electrode 6 with a three-dimensional wiring structure enables the area of the upper surface 2a of the circuit board 2 to be easily decreased.

In the case where metal pins having the same length are used to manufacture the inductor component 1a according to the present disclosure, for example, the components 4 are mounted on the upper surface 2a of the circuit board 2, and the inductor electrode 6 is formed on the lower surface of the circuit board 2. Resin layers are formed on both main surfaces of the circuit board 2, a metal pin for external connection is stood on one of the main surfaces of the circuit board 2, and the inductor component is connected to the mother substrate. Then, in either case where the metal pin for external connection is disposed on one main surface or the other main surface of the circuit board 2, a resin of one of the resin layers is interposed between the mother substrate having high heat dissipation characteristics and the components. However, in the case where the metal pins 7a to 7d having different lengths are used to form the inductor electrode 6 as in the case of the inductor component 1a according to the present embodiment, the circuit board 2 having heat dissipation characteristics higher than those of the resin layer 3 can be disposed between the components 4 and the mother substrate, and the inductor component 1a, which has particularly high heat dissipation characteristics, can be provided.

Since both ends of each of the wiring plates 8a to 8c reach the periphery of the resin layer 3, a metallic portion of the inductor component 1a can be increased unlike the case where the wiring plates 8a to 8c are each formed of only a portion that is needed to connect the end surfaces of the metal pins 7a to 7d to each other. Consequently, the heat dissipation characteristics of the inductor component 1a can be improved.

The difference in the potential between the long metal pins 7b and 7d forming the input and output terminals of the inductor electrode 6 increases, and there is a concern that the characteristics of the inductor electrode 6 are degraded due to a stray capacitance. According to the present embodiment, however, the metal pins 7b and 7d are disposed so as to be separated enough from each other, and accordingly, the stray capacitance can be reduced.

According to the present embodiment, the coil core 5 includes the annular portion 5a and the rod-like portion 5b, and the inductor electrode 6 is spirally wound in the length direction of the rod-like portion 5b. Thus, the coil core 5 is disposed on a magnetic flux path through which magnetic flux occurring when the inductor electrode 6 is energized passes, and the inductance value of the inductor electrode 6 can be effectively increased.

When the inductor component 1a according to the present embodiment is manufactured by using a pattern formed of a conductive paste or plating instead of the wiring plates 8a to 8c, after the components 4 are mounted on the upper surface 2a of the circuit board 2, the components 4 are sealed by a first resin layer, and a portion corresponding to the lower wiring plate 8c is formed on a surface of the first resin layer by using the conductive paste or plating. Subsequently, the coil core and the metal pins, for example, are disposed on the surface of the first resin layer and sealed by a second resin layer, and portions corresponding to the upper wiring plates 8a and 8b are formed on a surface of the second resin layer. In this case, it is necessary for portions corresponding to the resin layers and the wiring plates to be formed by two separated processes. According to the present embodiment, however, the inductor component 1a is manufactured by using the two etching plates 10a and 10b and the metal pins 7a to 7b having different lengths, and accordingly, the number of the formation of the resin layer 3 can be decreased to one time. Consequently, the manufacturing cost of the inductor component 1a can be reduced. In addition, there is no need for a printing process and a plating process, which are conventionally performed, and accordingly, the manufacturing cost of the inductor component 1a can be further decreased reduced.

(Modification to Arrangement of Metal Pins)

Figure 6A:
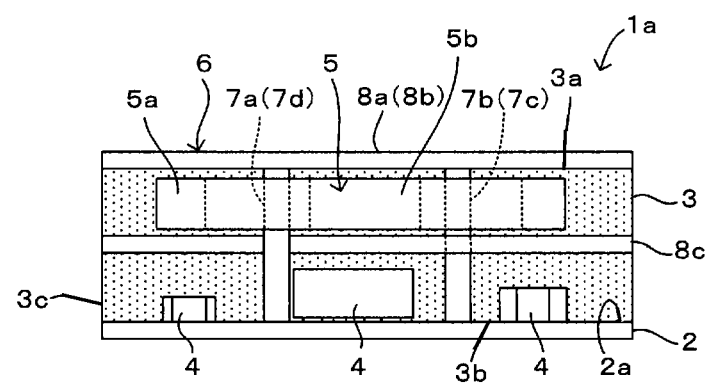
FIGS. 6A and 6B illustrate a modification to arrangement of metal pins.
Figure 6B:
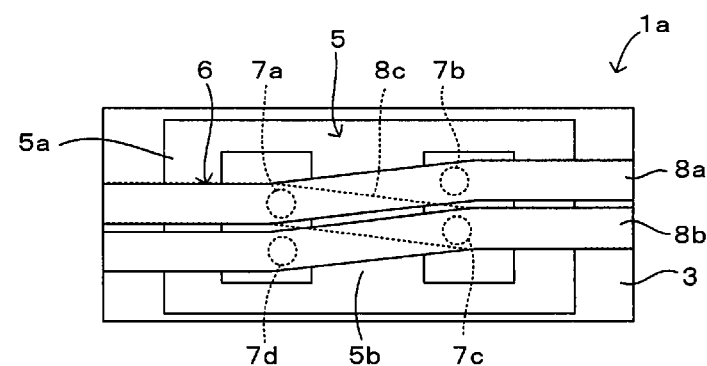

The locations at which the long metal pins 7b and 7d are disposed can be appropriately changed in accordance with the arrangement of the components 4. For example, as illustrated in FIGS. 6A and 6B, the two long metal pins 7b and 7d may be disposed in the inner region of the annular portion 5a of the coil core 5.

(Modification to Wiring Plates)

Figure 7A:
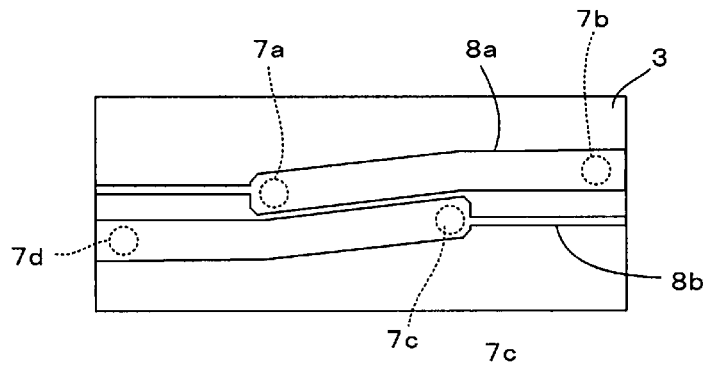
FIGS. 7A and 7B illustrate a modification to the wiring plates.
Figure 7B:
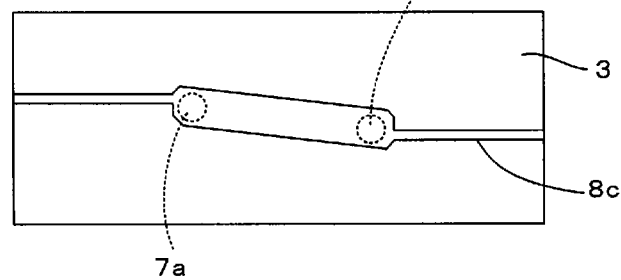

According to the above embodiment, each of the wiring plates 8a to 8c is formed to have a constant pattern width. However, as illustrated in, for example, FIGS. 7A and 7B, portions other than connections between the metal pins 7a to 7d may have a pattern width less than that of the connections.

Second Embodiment

Figure 8:
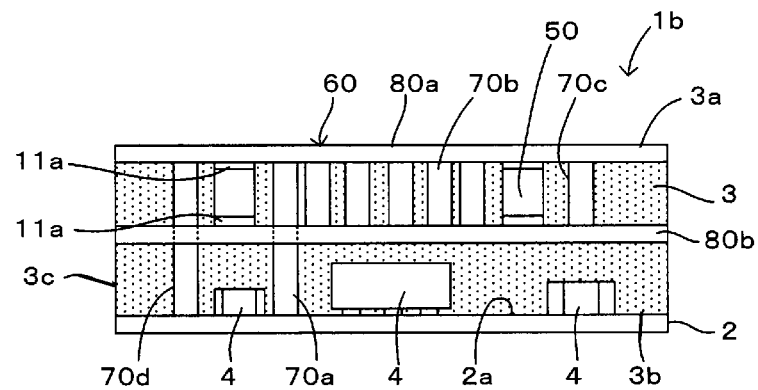
FIG. 8 illustrates an inductor component according to a second embodiment of the present disclosure.
Figure 9A:
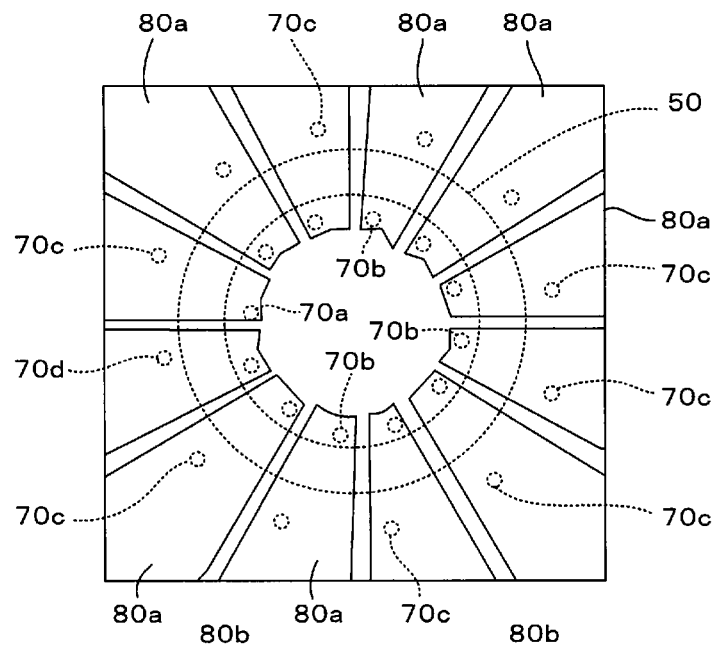
FIGS. 9A and 9b illustrate plan views of wiring plates in FIG. 8.
Figure 9B:
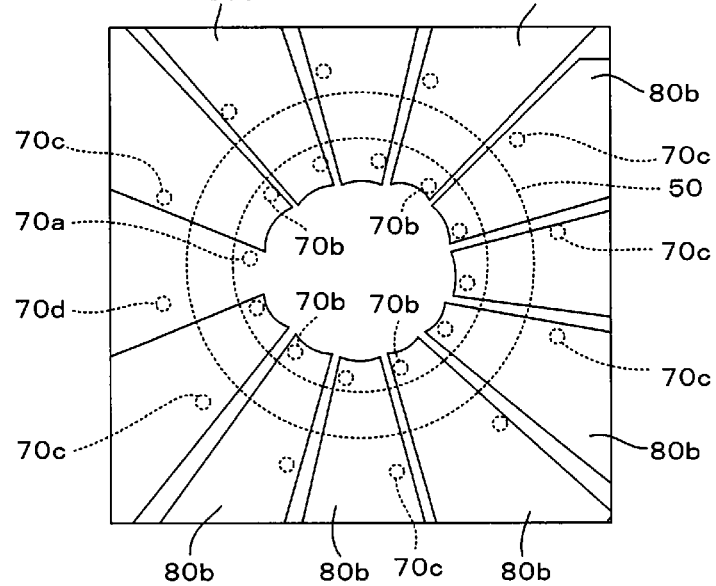
Figure 10:
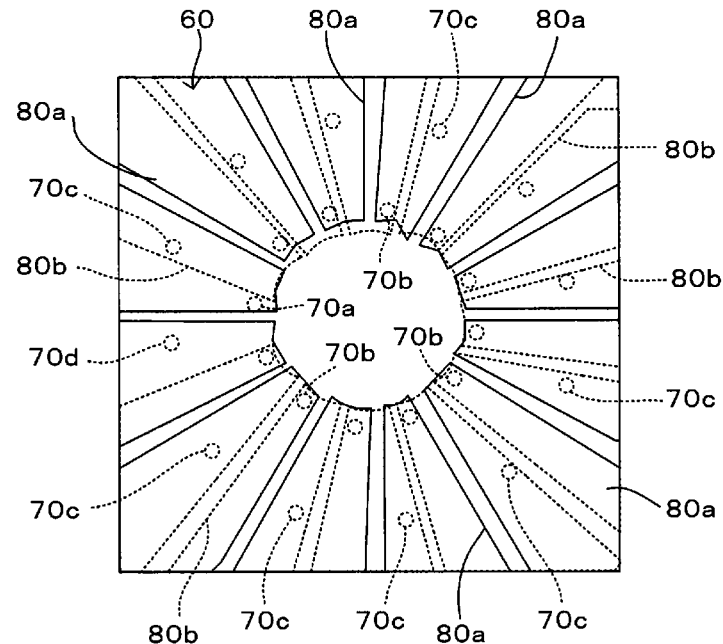
FIG. 10 illustrates a wiring structure of an inductor electrode in FIG. 8.

An inductor component according to a second embodiment of the present disclosure will be described with reference to FIG. 8 to FIG. 10. FIG. 8 illustrates the inductor component viewed from a direction parallel to the main surfaces of a circuit board, and an illustration of a part of a resin layer is omitted to see the internal structure. FIG. 9A is a plan view of upper wiring plates. FIG. 9B is a plan view of lower wiring plates. FIG. 10 illustrates a wiring structure of an inductor electrode and is a plan view of the wiring plates.

As illustrated in FIG. 8 to FIG. 10, an inductor component 1b according to the present embodiment differs from the inductor component 1a according to the first embodiment described with reference to FIG. 1 and FIGS. 2A to 2D in the shape of a coil core 50, the structure of an inductor electrode 60, and having insulating films 11a formed between the coil core 50 and wiring plates 80a and 80b. The other structures are the same as the inductor component 1a according to the first embodiment and are designated by like symbols, and a description thereof is omitted.

In this case, the coil core 50 has an annular shape (circular shape according to the present embodiment) in a plan view, and the inductor electrode 60 is spirally wound around the coil core 50. The insulating films 11a each formed of an insulating material such as an epoxy resin, polyimide, or a silicon resin are disposed between the coil core 50 and the wiring plates 80a and 80b.

The inductor electrode 60 includes upper wiring plates 80a disposed on the upper surface 3a of the resin layer 3, lower wiring plates 80b disposed inside the resin layer 3 such that the lower wiring plates 80b are paired with the upper wiring plates 80a, and inner metal pins 70a and 70b and outer metal pins 70c and 70d that connect the upper wiring plates 80a to the corresponding lower wiring plates 80b. The upper end surfaces of the metal pins 70a to 70d are exposed from the upper surface 3a of the resin layer 3. One of the inner metal pins 70a and 70b forms one of an input terminal and an output terminal of the inductor electrode 60, and one of the outer metal pins 70c and 70d forms the other of the input terminal and the output terminal of the inductor electrode 6.

Figure 11:
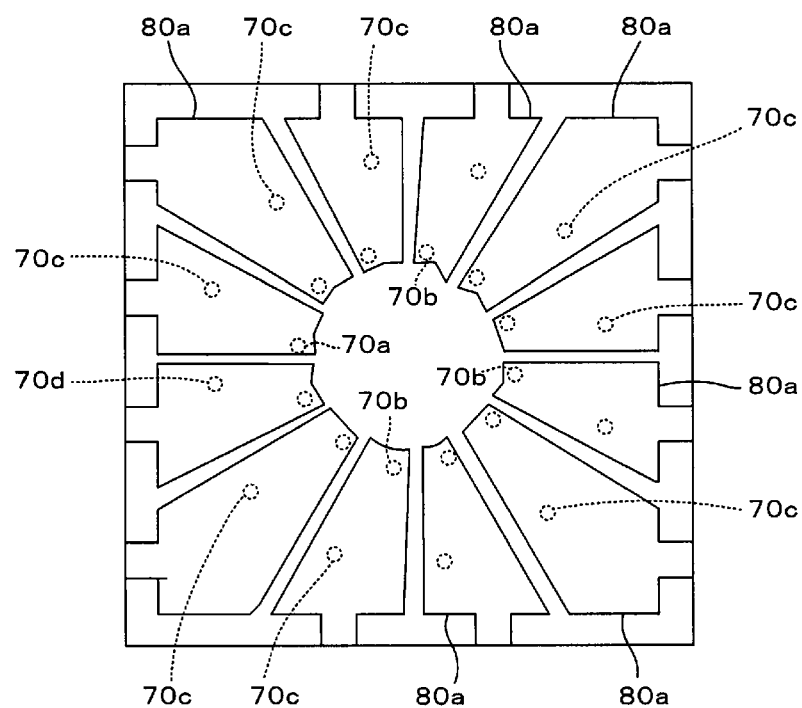
FIG. 11 illustrates a modification to the wiring plates in FIG. 9.

The shape of the wiring plates 80a and 80b in a plan view can be appropriately changed. For example, each of the wiring plates 80a and 80b may have a constant pattern width. For example, as illustrated in FIG. 11, an end of each of the wiring plates 80a and 80b may partially reach the periphery of the resin layer 3 in a plan view of the resin layer 3. FIG. 11 illustrates a modification to the wiring plates 80a and 80b and corresponds to FIG. 9A.

The upper wiring plates 80a are arranged in a direction (circumferential direction of the coil core 50) of the winding axis of the inductor electrode 60 in a state where one end is located on the inner circumferential side of the coil core 50, and the other end is located on the outer circumferential side of the coil core 50 in a plan view of the resin layer 3 (see FIG. 9A). The lower wiring plates 80b are arranged in the circumferential direction in a state where one end is located on the inner circumferential side of the coil core 50, and the other end is located on the outer circumferential side of the coil core 50 (see FIG. 9B) as in the upper wiring plates 80a. According to the present embodiment, the wiring plates 80a and 80b are tapered in a direction from the outer circumferential side to the inner circumferential side.

The upper wiring plates 80a are arranged at substantially regular intervals. The lower wiring plates 80b are arranged at substantially regular intervals (equal pitch). As illustrated in FIG. 9A, the upper wiring plates 80a are formed overall except for predetermined gaps between the adjoining upper wiring plates 80a in a plan view of the resin layer 3, and the width of the upper wiring plates 80a in the circumferential direction is increased. The same is true for the lower wiring plates 80b (see FIG. 9B).

As illustrated in FIG. 10, the upper wiring plates 80a shift to a predetermined side with respect to the lower wiring plates 80b that are paired therewith such that the upper wiring plates 80a overlap the lower wiring plates 80b that are paired therewith and the lower wiring plates 80b that are adjacent thereto on the predetermined side (clockwise direction according to the present embodiment).

The inner metal pins 70a and 70b extend in the resin layer 3 in the thickness direction and are arranged along the inner circumferential surface of the coil core 50. The inner metal pins 70b other than the inner metal pin 70a forming the input terminal or the output terminal of the inductor electrode 60 are disposed at the portions of the upper wiring plates 80a that are connected thereto and that overlap the lower wiring plates 80b paired therewith, and connect the ends of the upper wiring plates 80a paired therewith to the ends of the lower wiring plates 80b.

The outer metal pins 70c and 70d extend in the resin layer 3 in the thickness direction and are arranged along the outer circumferential surface of the coil core 50. The outer metal pins 70c other than the outer metal pin 70d forming the input terminal or the output terminal of the inductor electrode 60 are disposed at the portions of the upper wiring plates 80a that are connected thereto and that overlap the lower wiring plates 80b adjacent to the lower wiring plates 80b paired therewith on the predetermined side (clockwise direction), and connect the other ends of the upper wiring plates 80a to the other ends of the lower wiring plates 80b adjacent to the lower wiring plates 80b paired with the upper wiring plates 80a on the predetermined side.

The inner metal pin 70a and the outer metal pin 70d forming the input terminal and the output terminal of the inductor electrode 60 are longer than the other metal pins 70b and 70c, and the lower end surfaces thereof are exposed from the lower surface 3b of the resin layer 3 and connected to the circuit board 2 (see FIG. 8). The inductor component 1b according to the present embodiment can be manufactured in the same manner as the inductor component 1a according to the first embodiment. According to the present embodiment, the long metal pins 70a and 70d forming the input and output terminals of the inductor electrode 60 each correspond to the "second metal pin" according to the present disclosure, and the short metal pins 70b and 70c correspond to the "first metal pin" and the "third metal pin" according to the present disclosure. The upper wiring plates 80a correspond to the "first metal plate" and the "third metal plate" according to the present disclosure. The lower wiring plates 80b each correspond to the "second metal plate" according to the present disclosure.

According to the present embodiment, in which the inductor electrode 60 included in the inductor component 1b forms a toroidal coil, similar effects as in the inductor component 1a according to the first embodiment can be achieved.

Third Embodiment

Figure 12A:
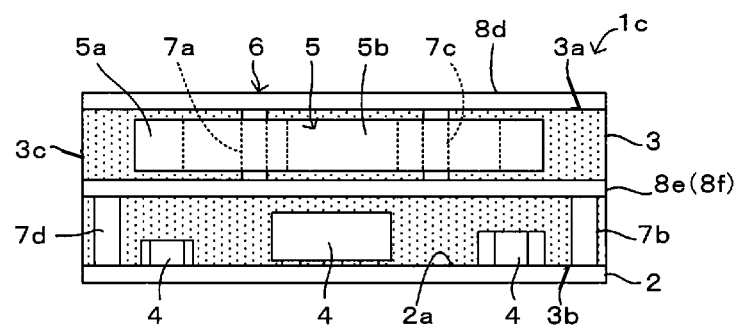
FIGS. 12A and 12B illustrate an inductor component according to a third embodiment of the present disclosure.
Figure 12B:
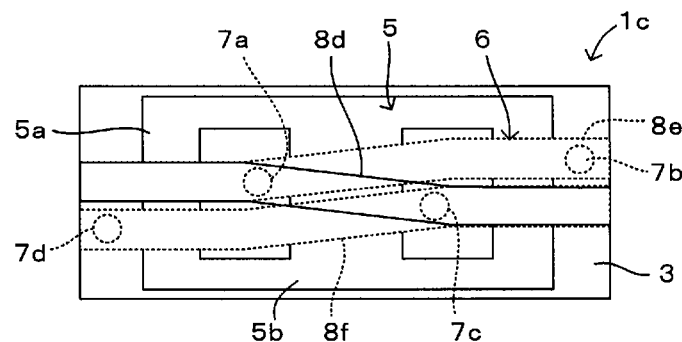

An inductor component according to a third embodiment of the present disclosure will be described with reference to FIGS. 12A and 12B. FIG. 12A illustrates the inductor component viewed from a direction parallel to the main surfaces of a circuit board. FIG. 12B is a plan view of the inductor component. In FIG. 12A, an illustration of a part of a resin layer is omitted to see the internal structure.

As illustrated in FIGS. 12A and 12B, an inductor component 1c according to the present embodiment differs from the inductor component 1a according to the first embodiment described with reference to FIG. 1 and FIGS. 2A to 2D in the connection structure of the inductor electrode 6. The other structures are the same as the inductor component 1a of the first embodiment and are designated by like symbols, and a description thereof is omitted.

In this case, the inductor electrode 6 is formed of an upper wiring plate 8d, two lower wiring plates 8e and 8f, and four metal pins 7a to 7d. The upper wiring plate 8d has the same shape as the lower wiring plate 8c according to the first embodiment (see FIG. 2B). The two lower wiring plates 8e and 8f have the same shape as the upper wiring plates 8a and 8b according to the first embodiment (see FIG. 2A). According to the first embodiment, the two metal pins 7b and 7d forming the input and output terminals of the inductor electrode 6 connect the upper wiring plates 8a and 8b and the circuit board 2 to each other. According to the present embodiment, the two metal pins 7b and 7d are shorter than in the first embodiment and connect the lower wiring plates 8e and 8f and the circuit board 2 to each other.

With this structure, the inductor electrode 6 is formed of the metal pins 7a to 7d and the wiring plates 8d to 8f that each have a specific electrical resistance lower than that of a conductive paste and plating, and the resistance of the entire inductor electrode 6 can be decreased. Consequently, the characteristics (for example, the inductance value) of the inductor component 1c can be improved.

Fourth Embodiment

Figure 13A:
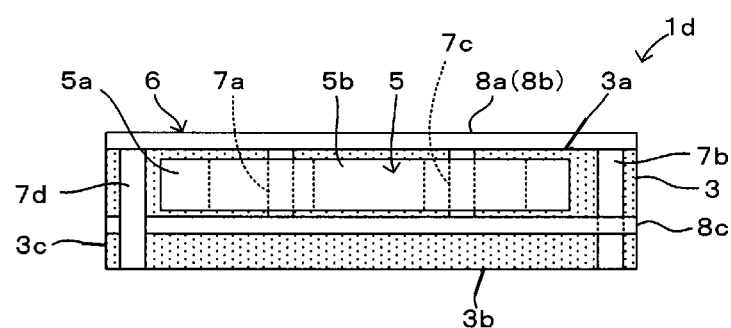
FIGS. 13A and 13B illustrate an inductor component according to a fourth embodiment of the present disclosure.

An inductor component according to a fourth embodiment of the present disclosure will be described with reference to FIG. 13A. FIG. 13A illustrates the inductor component viewed from a direction parallel to the main surfaces of a circuit board and corresponds to FIG. 1 illustrating the inductor component according to the first embodiment.

As illustrated in FIG. 13A, an inductor component 1d according to the present embodiment differs from the inductor component 1a according to the first embodiment described with reference to FIG. 1 and FIGS. 2A to 2D in including neither the circuit board 2 nor the components 4, which are included in the inductor component 1a according to the first embodiment. The other structures are the same as the inductor component 1a of the first embodiment and are designated by like symbols, and a description thereof is omitted.

Figure 13B:
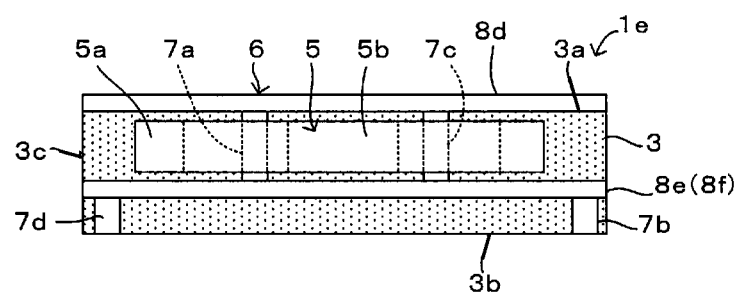

In this case, the lower end surfaces of the two long metal pins 7b and 7d are exposed from the lower surface 3b of the resin layer 3 and used as input and output electrodes. With this structure, the inductor component 1d including neither the circuit board 2 nor the components 4 can achieve the same effects as in the first embodiment. As illustrated in FIG. 13B, the circuit board 2 and the components 4 may be removed from the structure of the inductor component 1c according to the third embodiment to form an inductor component 1e.

Fifth Embodiment

Figure 14:
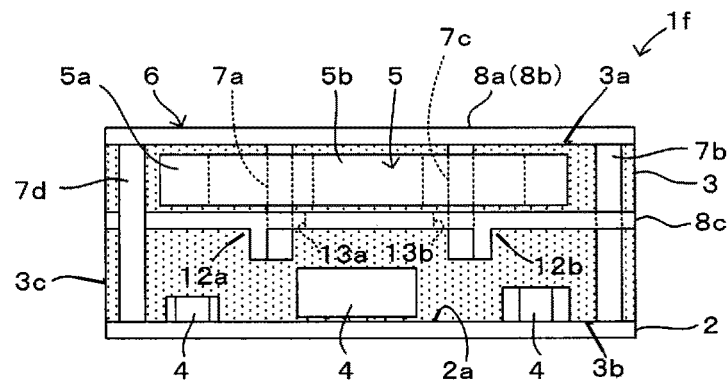
FIG. 14 illustrates an inductor component according to a fifth embodiment of the present disclosure.
Figure 15:
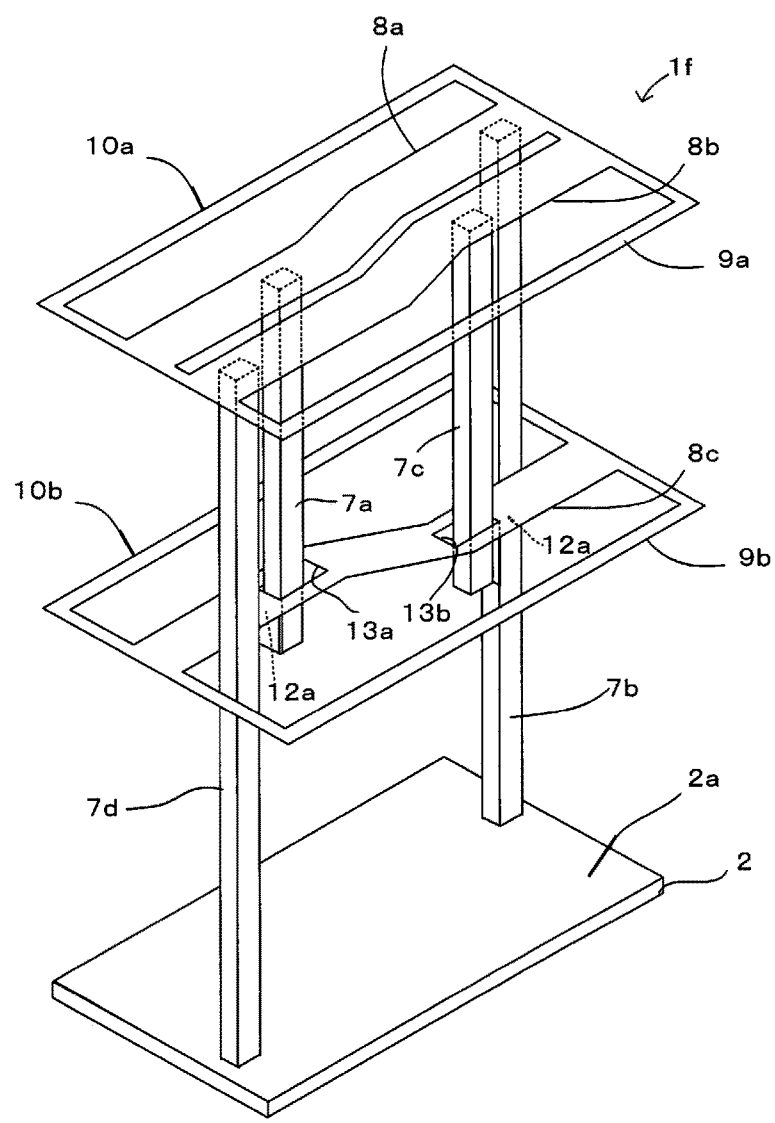
FIG. 15 is a perspective view of the inductor component in FIG. 14.

An inductor component according to a fifth embodiment of the present disclosure will be described with reference to FIG. 14 and FIG. 15. FIG. 14 illustrates the inductor component viewed from a direction parallel to the main surfaces of a circuit board. FIG. 15 is a perspective view of the inductor component with the resin layer 3, the components 4, and the coil core 5 omitted. FIG. 15 illustrates the inductor component in a state where the frames 9a and 9b, which are finally removed, are attached thereto.

As illustrated in FIG. 14, an inductor component 1f according to the present embodiment differs from the inductor component 1a according to the first embodiment described with reference to FIG. 1 and FIGS. 2A to 2D in the connection structure of the inductor electrode 6. The other structures are the same as the inductor component 1a of the first embodiment and are designated by like symbols, and a description thereof is omitted.

In this case, the lower wiring plate 8c includes two bent portions 12a and 12b (each corresponding to a "first bent portion" according to the present disclosure) formed such that regions overlapping the two short metal pins 7a and 7c in a plan view are bent in a direction (downward according to the present embodiment) perpendicular to the main surfaces (the upper surface 3a and the lower surface 3b) of the resin layer 3. Two insertion holes 13a and 13b (each corresponding to a "first insertion hole" according to the present disclosure) through which the lower end portions of the two short metal pins 7a and 7c are inserted are formed at the bent portions 12a and 12b.

The metal pins 7a to 7d each have a quadrangular prism shape having a rectangular section in a direction parallel to the main surfaces (the upper surface 3a and the lower surface 3b) of the resin layer 3. The two short metal pins 7a and 7c are longer than distances between the upper wiring plates 8a and 8b and the lower wiring plate 8c.

The two insertion holes 13a and 13b formed in the lower wiring plate 8c each have a rectangular shape in a plan view, and the two short metal pins 7a and 7c can be inserted therethrough. As illustrated in FIG. 15, a part of the bent portion 12a (the bent portion on the left-hand side in FIG. 14) that is originally a part of the upper surface of the lower wiring plate 8c is in contact with a left-hand side surface of a lower end portion of the metal pin 7a (the metal pin on the left-hand side in FIG. 14), and the metal pin 7a and the lower wiring plate 8c are connected to each other. A part of the bent portion 12b (the bent portion on the right-hand side in FIG. 14) that is originally a part of the upper surface of the lower wiring plate 8c is in contact with a right-hand side surface of a lower end portion of the metal pin 7c (the metal pin on the right-hand side in FIG. 14), and the metal pin 7c and the lower wiring plate 8c are connected to each other.

(Method for Manufacturing Inductor Component 1f)

Figure 16A:
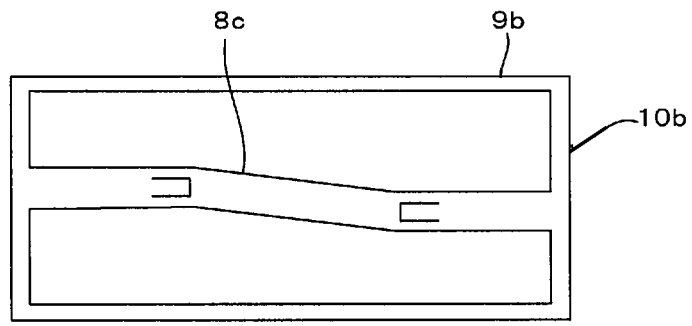
FIGS. 16A to 16C illustrate plan views of a wiring plate in FIG. 14.
Figure 16B:
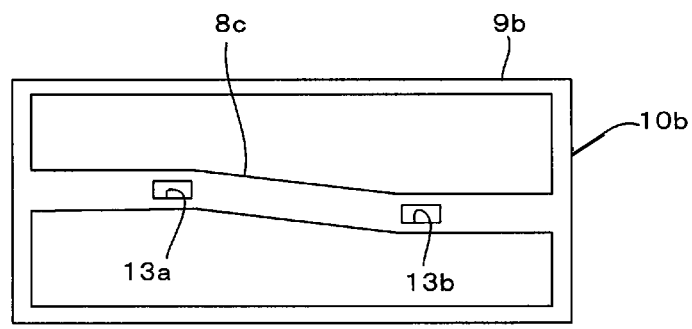
Figure 16C:
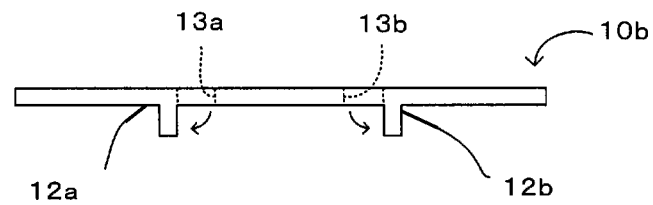

A method for manufacturing the inductor component 1f, mainly, the differences from the method for manufacturing the inductor component 1a according to the first embodiment, will be described with reference to FIGS. 16A to 16C and FIGS. 17A to 17F. FIGS. 16A to 16C illustrate plan views of the lower wiring plate 8c supported by the frames 9a and 9b. FIGS. 17A to 17F illustrate the method for manufacturing the inductor component 1f.

The first and second etching plates 10a and 10b are prepared in the same manner as the method for manufacturing the inductor component 1a according to the first embodiment. In the second etching plate 10b, on which the lower wiring plate 8c is to be formed, cuts each having a U-shape turned sideways are made in predetermined regions including regions overlapping the two short metal pins 7a and 7c in a plan view (see FIG. 16A). Subsequently, portions having the cuts are bent downward to form the bent portions 12a and 12b on the lower wiring plate 8c (see FIG. 16C). This bending process forms the insertion holes 13a and 13b that are rectangular in a plan view (see FIG. 16B).

Figure 17A:
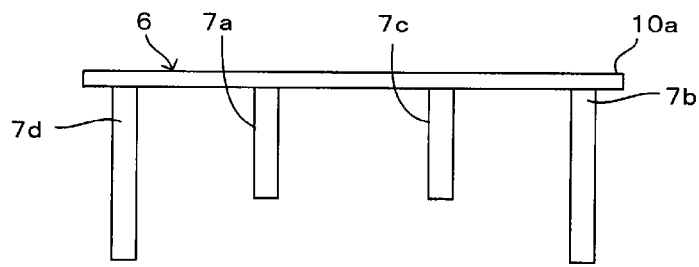
FIGS. 17A to 17F illustrate a method for manufacturing the inductor component in FIG. 14.
Figure 17B:
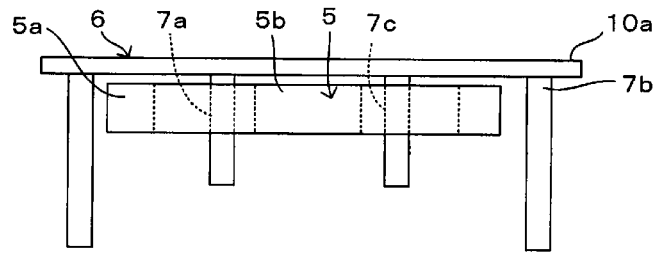

Subsequently, in the same manner as the method for manufacturing the inductor component 1a according to the first embodiment, the upper end surfaces of the metal pins 7a to 7d are connected at predetermined positions to one surface of each of the upper wiring plates 8a and 8b of the first etching plate 10a (see FIG. 17A), and the coil core 5 is disposed at a predetermined position (see FIG. 17B). At this time, the coil core 5 is disposed such that the rod-like portion 5b is located between the short metal pins 7a and 7c, and the long metal pins 7b and 7d are located outside the annular portion 5a.

Figure 17C:
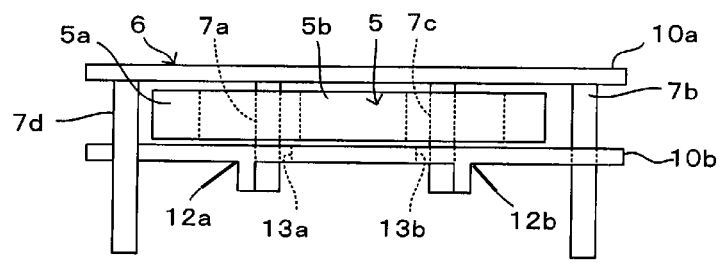

Subsequently, as illustrated in FIG. 17C, the inductor electrode 6 is formed in a manner in which the lower end portions of the two short metal pins 7a and 7c are inserted through the corresponding insertion holes 13a and 13b, and the metal pins 7a and 7c and the lower wiring plate 8c are connected to each other. At this time, a part of the bent portion 12a (the bent portion on the left-hand side in FIG. 17C) that is originally a part of the upper surface of the lower wiring plate 8c is in contact with a left-hand side surface of a lower end portion of the metal pin 7a (the metal pin on the left-hand side in FIG. 17C), and the metal pin 7a and the lower wiring plate 8c are connected to each other. A part of the bent portion 12b (the bent portion on the right-hand side in FIG. 17C) that is originally a part of the upper surface of the lower wiring plate 8c is in contact with a right-hand side surface of a lower end portion of the metal pin 7c (the metal pin on the right-hand side in FIG. 17C), and the metal pin 7c and the lower wiring plate 8c are connected to each other. According to the present embodiment, the portions having the cuts are bent downward to form the insertion holes 13a and 13b. However, the portions having the cuts may be bent upward to form the insertion holes 13a and 13b.

Figure 17D:
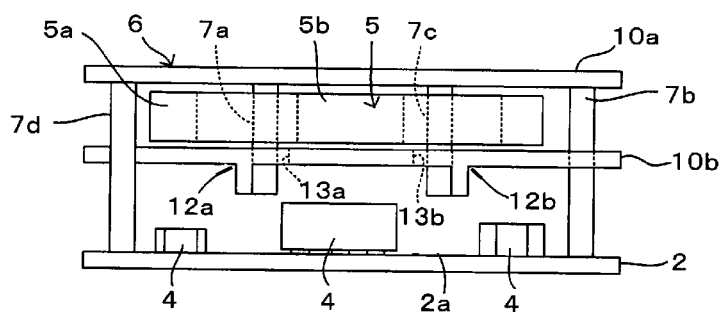
Figure 17E:
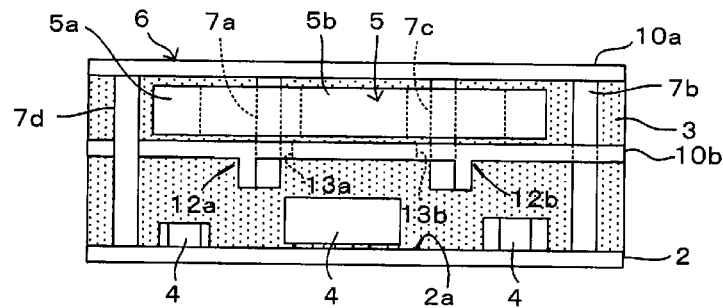
Figure 17F:
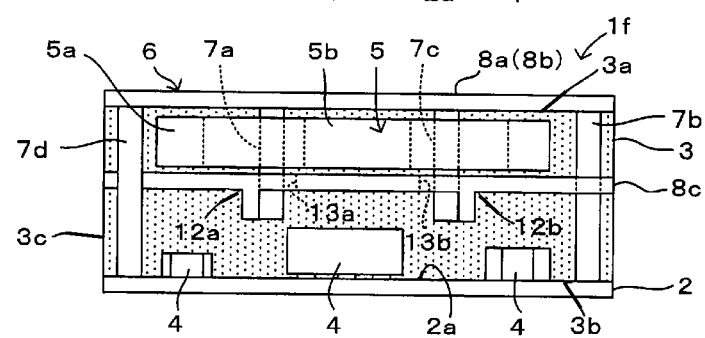

Processes from the formation of the inductor electrode 6 to the completion of the inductor component 1f are the same as those in the method for manufacturing the inductor component 1a according to the first embodiment (see FIG. 17D to FIG. 17F).

According to the present embodiment, in addition to the same effects as in the inductor component 1a according to the first embodiment, the contact area between the lower wiring plate 8c and the two short metal pins 7a and 7c can be readily increased in a manner in which the portions of the lower wiring plate 8c that are bent in a direction perpendicular to the main surfaces (the upper surface 3a and the lower surface 3b) of the resin layer 3 are brought into contact with the side surfaces of the short metal pins 7a and 7c. For example, in the case where the upper surface of the lower wiring plate 8c and the lower end surfaces of the metal pins 7a and 7c are connected to each other to connect the short metal pins 7a and 7c and the lower wiring plate 8c to each other, a variation in the length of the metal pins 7a and 7c causes a failure of the connection between the metal pins 7a and 7c and the lower wiring plate 8c. According to the present embodiment, however, since the lower end portions of the metal pins 7a and 7c are inserted through the insertion holes 13a and 13b of the lower wiring plate 8c, the metal pins 7a and 7c and the lower wiring plate 8c can be connected to each other with certainty even when there is a variation in the length of the metal pins 7a and 7c.

(Modification to Insertion Holes)

Figure 18A:
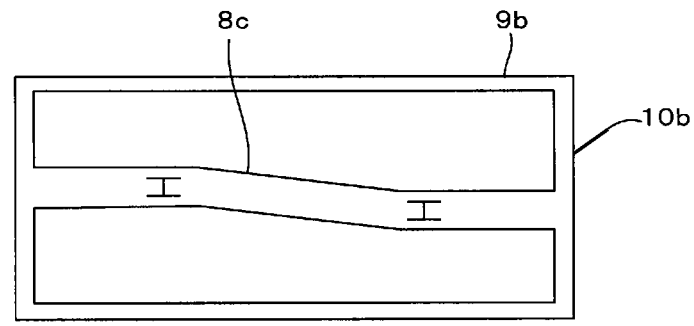
FIGS. 18A and 18B illustrate a modification to insertion holes in FIG. 14.
Figure 18B:
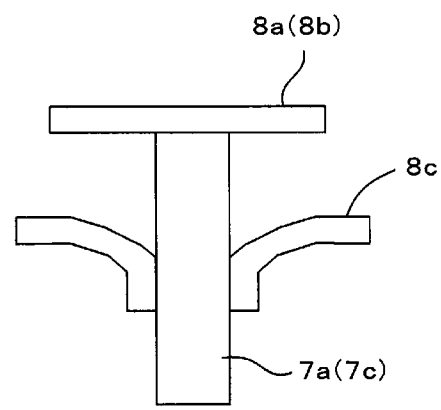

A modification to the insertion holes will now be described with reference to FIGS. 18A and 18B. FIG. 18A is a plan view of a second etching plate according to the modification. FIG. 18B illustrates a state where a metal pin is inserted through an insertion hole.

In the example described according to the above embodiment, the cuts each having a U-shape turned sideways are formed when the insertion holes 13a and 13b that are rectangular in a plan view are formed. For example, as illustrated in FIG. 18A, cuts each having an H-shape turned sideways may be made in portions at which the insertion holes 13a and 13b of the lower wiring plate 8c are to be formed, and the lower end portions of the metal pins 7a and 7c may be inserted into the cuts. In this case, as illustrated in FIG. 18B, the right-hand side surface and the left-hand side surface of the lower end portion of each of the metal pins 7a and 7c can be connected to the lower wiring plate 8c, and this improves the reliability of the connection between the metal pins 7a and 7c and the lower wiring plate 8c. In this case, the reliability of the connection to the lower wiring plate 8c can be ensured also when the metal pins 7a and 7c are columnar.

(Modification to Metal Pins)

Figure 19:
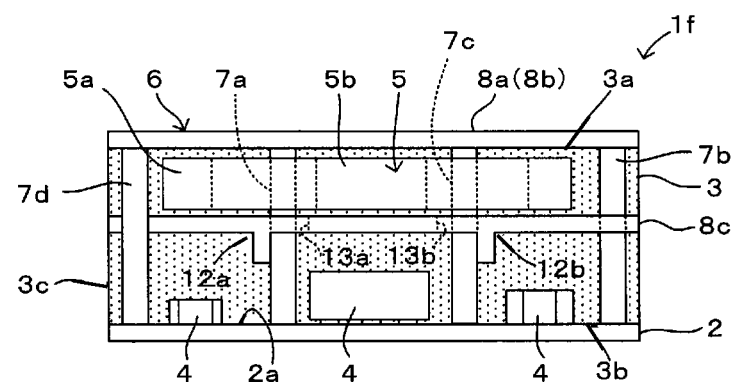
FIG. 19 illustrates a modification to metal pins in FIG. 14.

In the inductor component if according to the fifth embodiment, the four metal pins 7a to 7d forming a part of the inductor component if include two types of long metal pins and short metal pins. However, as illustrated in FIG. 19, all the metal pins 7a to 7d may have the same length. This enables common metal pins to be used as the metal pins 7a to 7d and enables the cost of the inductor component if to be decreased.

(Modification to Inductor Electrode)

Figure 20:
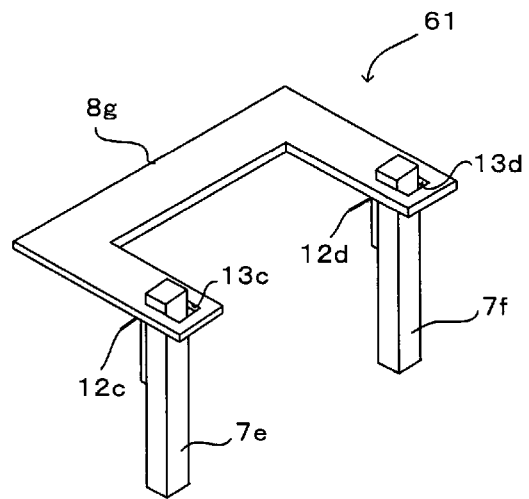
FIG. 20 is a perspective view of a modification to an inductor electrode in FIG. 14.

In the example described according to the above embodiment, the inductor electrode 6 is wound around the rod-like portion 5b of the coil core 5 to form the coil. However, as illustrated in, for example, FIG. 20, an inductor element may be formed such that an inductor electrode 61 is formed of metal pins 7e and 7f and a wiring plate 8g into a predetermined pattern without the coil core 5.

In this case, the wiring plate 8g (corresponding to the "first metal plate" according to the present disclosure) has a U-shape turned sideways in a plan view and is disposed on the upper surface 3a of the resin layer 3. The wiring plate 8g includes, at both end portions, bent portions 12c and 12d (corresponding to the "second bent portion" and the "third bent portion" according to the present disclosure) formed such that portions thereof are bent in a direction (downward according to the present embodiment) perpendicular to the upper surface 3a of the resin layer 3. An insertion hole 13c (corresponding to "one of the third insertion hole and the fourth insertion hole" according to the present disclosure) through which the upper end portion of the metal pin 7e is inserted is formed at the bent portion 12c. An insertion hole 13d (corresponding to "the other of the third insertion hole and the fourth insertion hole" according to the present disclosure) through which the upper end portion of the metal pin 7f is inserted is formed at the bent portion 12d.

Sixth Embodiment

Figure 21:
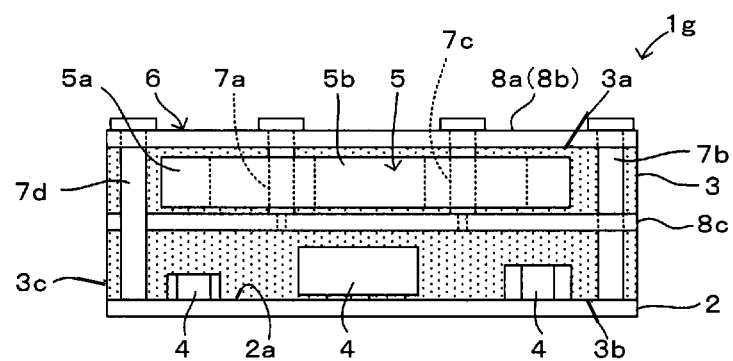
FIG. 21 illustrates an inductor component according to a sixth embodiment of the present disclosure.

An inductor component according to a sixth embodiment of the present disclosure will be described with reference to FIG. 21. FIG. 21 illustrates the inductor component viewed from a direction parallel to the main surfaces of a circuit board and corresponds to FIG. 1.

As illustrated in FIG. 21, an inductor component 1g according to the present embodiment differs from the inductor component 1a according to the first embodiment described with reference to FIG. 1 and FIGS. 2A to 2D in the structure of the inductor electrode 6. The other structures are the same as the inductor component 1a of the first embodiment and are designated by like symbols, and a description thereof is omitted.

In this case, the upper end portions of the metal pins 7a to 7d each have a flange shape, and the lower end portions of the two short metal pins 7a and 7c are narrower than the other portions of the metal pins 7a and 7c. Insertion holes 13e and 13g (each corresponding to the "fifth insertion hole" according to the present disclosure") through which the short metal pins 7a and 7c are inserted, and insertion holes 13f and 13h (each corresponding to the "sixth insertion hole" according to the present disclosure) through which the long metal pins 7b and 7d are inserted are formed in the two upper wiring plates 8a and 8b (see FIGS. 22A and 22B). The diameter W1 of the insertion holes 13e to 13h is less than the width W2 of the upper end portions (having a flange shape) of the metal pins 7a to 7d inserted therethrough, and larger than the diameter W3 of the main bodies of the metal pins except for both end portions. The upper end portions of the metal pins 7a to 7d engage the upper wiring plates 8a and 8b (see FIG. 24). The lower end portions of the two short metal pins 7a and 7c are narrower than the main bodies of the metal pins 7a and 7c (diameter W3 of the main bodies>diameter W4 of the lower end portions).

Figure 22A:
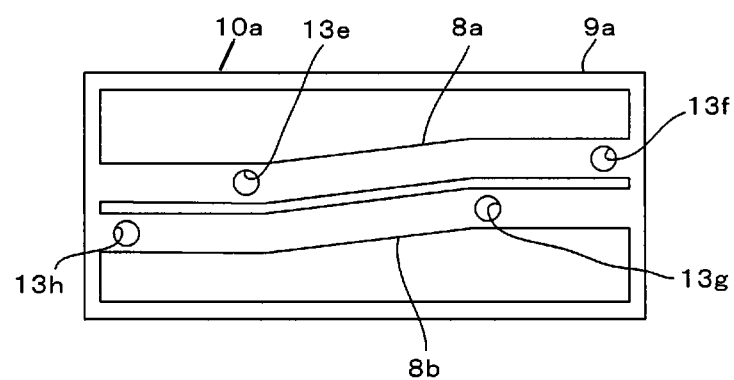
FIGS. 22A and 22B illustrate plan views of wiring plates in FIG. 21.
Figure 22B:
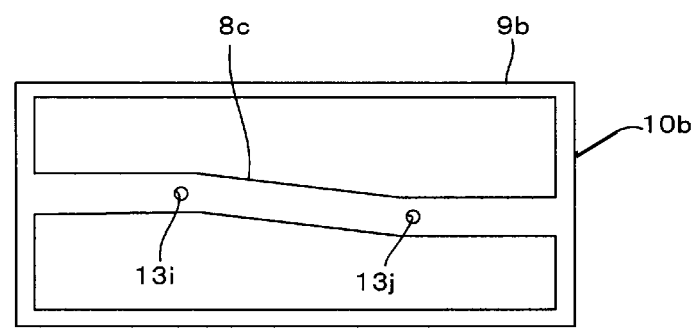
Figure 24:
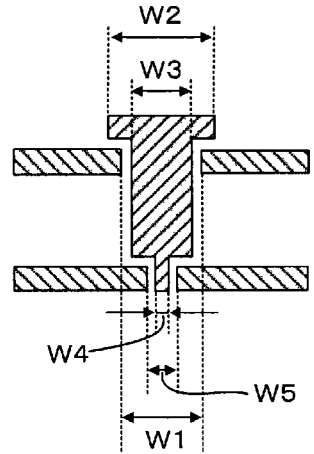
FIG. 24 is a sectional view of main parts of metal pins and insertion holes in FIG. 21 and illustrates the relationship therebetween.

The lower wiring plate 8c has two insertion holes 13i and 13j through which the lower end portions of the two short metal pins 7a and 7c are inserted (see FIGS. 22A and 22B). As illustrated in FIG. 24, the diameter W5 of the insertion holes 13i and 13j is smaller than the diameter W3 of the main bodies of the metal pins 7a and 7c inserted therethrough and larger than the diameter W4 of the lower end portions. When the lower end portions of the metal pins 7a and 7c are inserted through the insertion holes 13i and 13j, the main bodies of the metal pins 7a and 7c and the upper surface of the lower wiring plate 8c come into contact with each other and can be connected to each other.

(Method for Manufacturing Inductor Component 1g)

A method for manufacturing the inductor component 1g, mainly, the differences from the method for manufacturing the inductor component 1a according to the first embodiment, will now be described with reference to FIGS. 22A and 22B, and FIGS. 23A to 23F. FIGS. 22A and 22B illustrate plan views of the wiring plates 8a to 8c supported by the frames 9a and 9b. FIGS. 23A to 23F illustrate the method for manufacturing the inductor component 1g.

The first and second etching plates 10a and 10b are prepared in the same manner as the method for manufacturing the inductor component 1a according to the first embodiment. At this time, the insertion holes 13e to 13j are formed at predetermined positions in the wiring plates 8a to 8c. The insertion hole 13e to 13j can be formed by, for example, a punching process, a laser process, or etching.

Figure 23A:
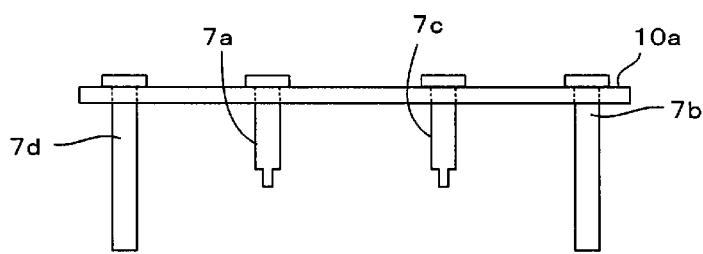
FIGS. 23A to 23F illustrate a method for manufacturing the inductor component in FIG. 21.

Subsequently, as illustrated in FIG. 23A, the metal pins 7a to 7d are inserted in (inserted through) the insertion holes 13e to 13h of the first etching plate 10a. At this time, the upper end portions (having a flange shape) of the metal pins 7a to 7d engage the upper wiring plates 8a and 8b.

Figure 23B:
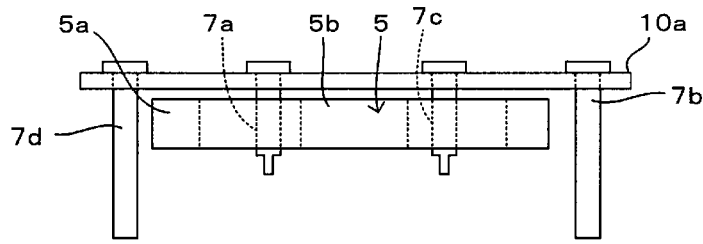

Subsequently, as illustrated in FIG. 23B, the coil core 5 is disposed in the same manner as in the method for manufacturing the inductor component 1a according to the first embodiment.

Figure 23C:
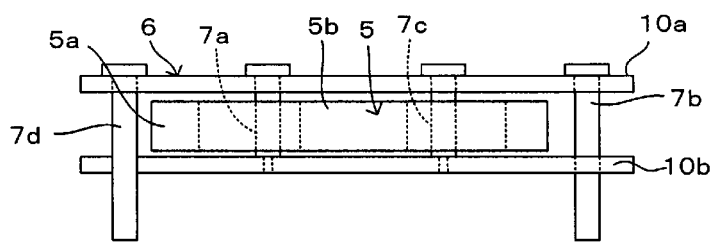

Subsequently, as illustrated in FIG. 23C, the lower end portions of the two short metal pins 7a and 7c are inserted through the insertion holes 13i and 13j formed in the second etching plate 10b to form the inductor electrode 6.

Figure 23D:
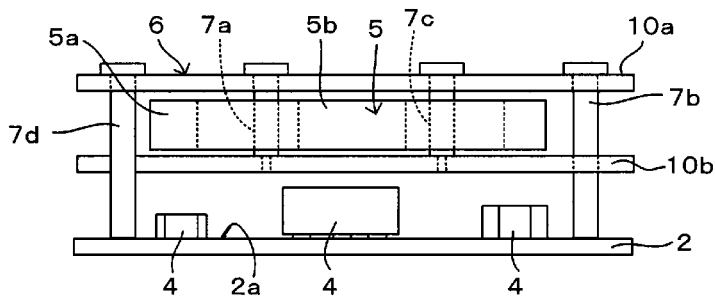
Figure 23E:
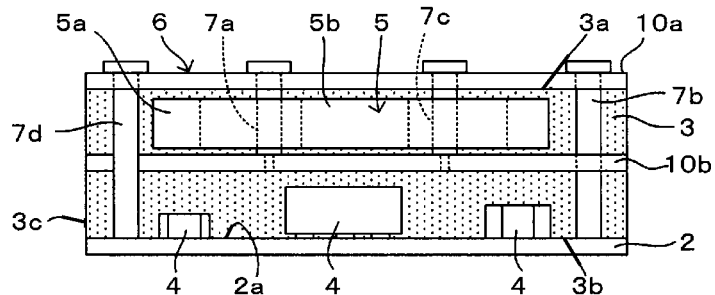
Figure 23F:
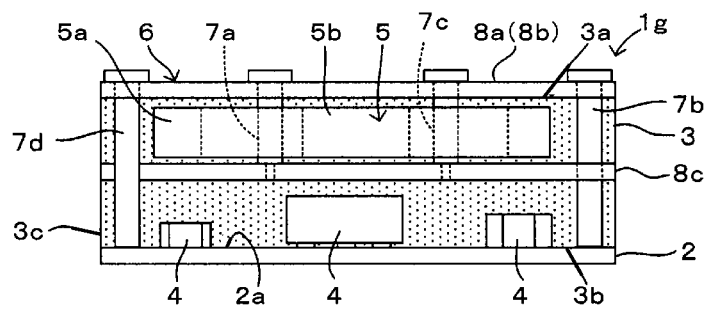

Process after the inductor electrode 6 is formed, which complete the inductor component 1g, are the same as in the method for manufacturing the inductor component 1a according to the first embodiment (see FIG. 23D to FIG. 23F).

According to the present embodiment, similar effects as in the inductor component 1a according to the first embodiment can be achieved. As illustrated in FIG. 24, the insertion holes 13e to 13j are larger than the portions of the metal pins 7a to 7d inserted therethrough (for example, the lower end portions). This improves the likelihood of high positional accuracy when the metal pins 7a to 7d are inserted through the insertion holes 13e to 13j. Since the size of the insertion holes 13e to 13h formed in the upper wiring plates 8a and 8b are less than the width of the upper end portions (having a flange shape) of the metal pins 7a to 7d inserted therethrough, the upper end portions of the metal pins 7a to 7d and the upper wiring plates 8a and 8b can be connected to each other with certainty. Since the diameter W5 of the insertion holes 13i and 13j formed in the lower wiring plate 8c is smaller than the diameter W3 of the main bodies of the metal pins 7a and 7c inserted therethrough, the lower end portions of the metal pins 7a to 7c and the lower wiring plate 8c can be connected to each other with certainty.

(Modification Metal Pins)

Figure 25:
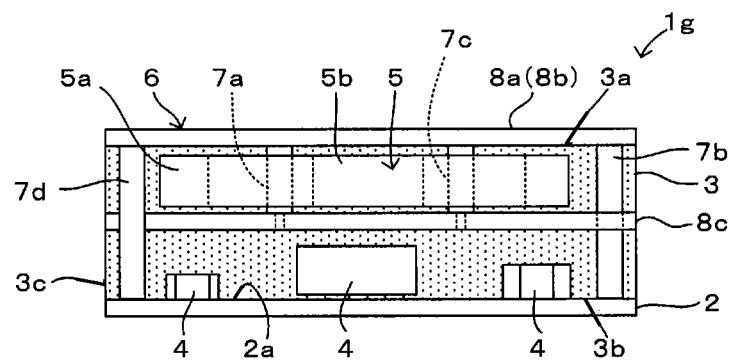
FIG. 25 illustrates a modification to the metal pins in FIG. 21.
Figure 26:
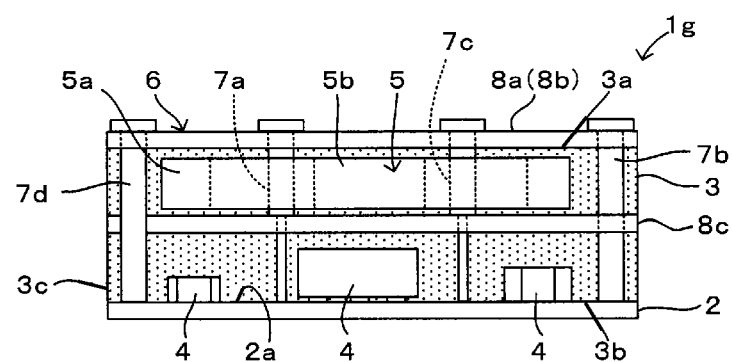
FIG. 26 illustrates another modification to the metal pins in FIG. 21.
Figure 27:
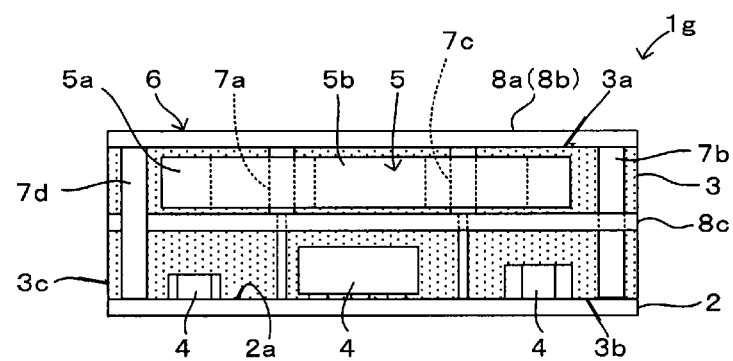
FIG. 27 illustrates another modification to the metal pins in FIG. 21.

A modification to the metal pins 7a to 7d of the inductor component 1g according to the present embodiment will now be described with reference to FIG. 25 to FIG. 27. FIG. 25 to FIG. 27 illustrate the inductor component 1g viewed from a direction parallel to the main surfaces of the circuit board 2 and correspond to FIG. 1.

For example, as illustrated in FIG. 25, the upper end portions of the metal pins 7a to 7d may not have a flange shape. In this case, the upper end portions (the upper end surfaces) of the metal pins 7a to 7d may be joined to the upper wiring plates 8a and 8b with solder.

As illustrated in FIG. 26, the four metal pins 7a to 7d may have the same length. In this case, as illustrated in FIG. 26, portions extending from the lower end portions of the two short metal pins 7a and 7c to the upper surface 2a of the circuit board 2 may have the same diameter as the diameter W4 of the lower end portions (see FIG. 24). This enables an inductor component to be manufactured in the same manner as in the method for manufacturing the inductor component 1g according to the sixth embodiment.

As illustrated in FIG. 27, according to the modification to the inductor component 1g that is illustrated in FIG. 26, the upper end portions may not have a flange shape. In this case, the upper end portions (the upper end surfaces) of the metal pins 7a to 7d may be connected to the upper wiring plates 8a and 8b with solder.

(Modification to Inductor Electrode)

Figure 28:
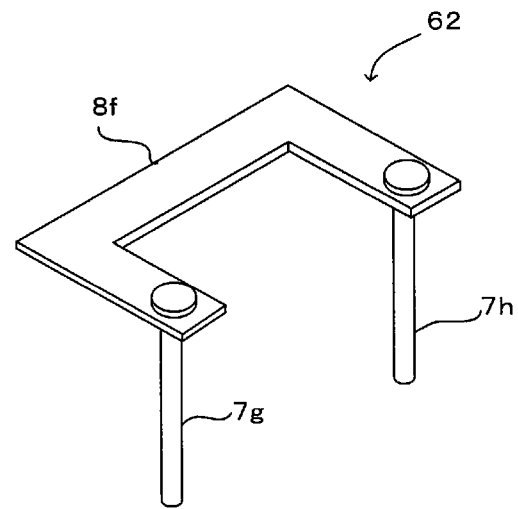
FIG. 28 is a perspective view of a modification to an inductor electrode in FIG. 21.

In the example described according to the above embodiment, the inductor electrode 6 is the coil wound around the rod-like portion 5b of the coil core 5. However, as illustrated in, for example, FIG. 28, an inductor element may be formed such that an inductor electrode 62 is formed of metal pins 7g and 7h and the wiring plate 8f into a predetermined pattern without the coil core 5. In this case, the upper end portions of the metal pins 7g and 7h each have a flange shape, and both end portions of the wiring plate 8f have insertion holes through which the metal pins 7g and 7h are inserted. The diameter of the insertion holes is smaller than the diameter of the upper end portions (having a flange shape) of the metal pins 7g and 7h and larger than the diameter of the main bodies.

Seventh Embodiment

Figure 29:
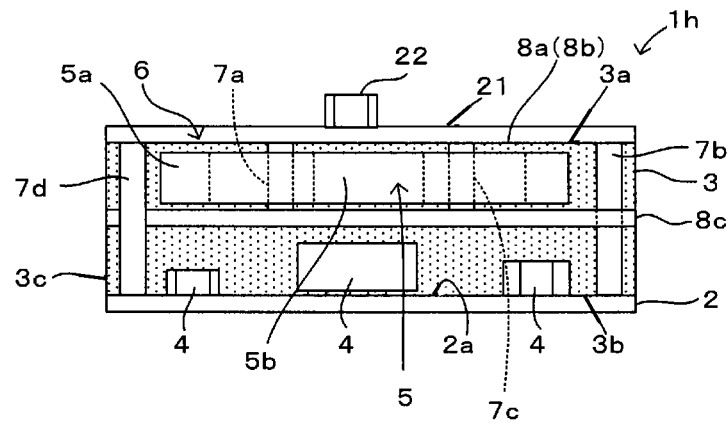
FIG. 29 illustrates an inductor component according to a seventh embodiment of the present disclosure.

An inductor component according to a seventh embodiment of the present disclosure will be described with reference to FIG. 29. FIG. 29 illustrates the inductor component viewed from a direction parallel to the main surfaces of a circuit board, and an illustration of a part of a resin layer is omitted to see the internal structure.

As illustrated in FIG. 29, an inductor component 1h according to the present embodiment differs from the inductor component 1a according to the first embodiment described with reference to FIG. 1 and FIGS. 2A to 2D in that a component-mounting substrate 21 includes the upper wiring plates 8a and 8b, and the component-mounting substrate 21 including the upper wiring plates 8a and 8b is stacked on the upper surface 3a of the resin layer 3. The other structures are the same as the inductor component 1a according to the first embodiment and are designated by like symbols, and a description thereof is omitted.

The component-mounting substrate 21 has a first main surface (the surface opposite the surface facing the resin layer 3) and a second main surface (the surface facing the resin layer 3), and a component 22 is mounted on the first main surface of the component-mounting substrate (corresponding to the "substrate that includes a component disposed on the first main surface" according to the present disclosure) 21, which is stacked on the upper surface 3a of the resin layer 3. The component 22 is composed of, for example, a semiconductor element formed of, for example, Si, a chip capacitor, a chip inductor, or a chip resistance. The component 22 mounted on the first main surface of the component-mounting substrate 21 can be, for example, one of the components 4 mounted on the upper surface 2a of the circuit board 2 according to the first embodiment.

The upper wiring plates 8a and 8b are electrodes disposed in an inner layer of the component-mounting substrate 21 or on a surface layer on the second main surface side. The upper wiring plate 8a is in contact with the upper surfaces of the metal pins 7a and 7b. The upper wiring plate 8b is in contact with the upper surfaces of the metal pins 7c and 7d.

According to the present embodiment, similar effects as in the inductor component 1a according to the first embodiment can be achieved. In addition, the components can be mounted on two substrates, that is, the upper surface 2a of the circuit board 2 and the first main surface of the component-mounting substrate 21, and a production area of the inductor component 1h can be reduced.

(Modification to Inductor Component)

Figure 30:
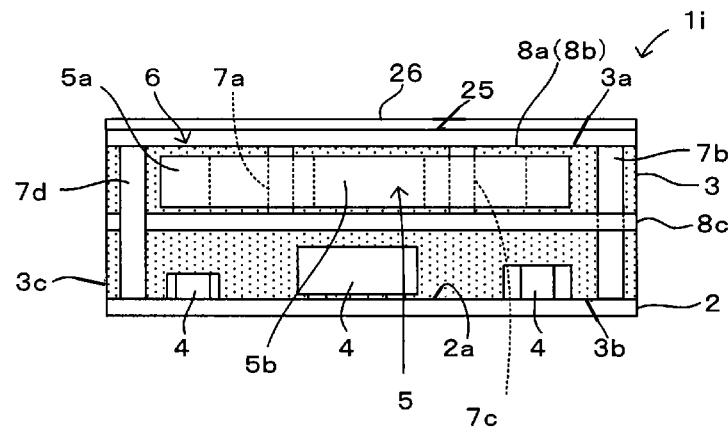
FIG. 30 illustrates a modification to the inductor component in FIG. 29.

A modification to the above inductor component in FIG. 29 will now be described with reference to FIG. 30. FIG. 30 illustrates the inductor component viewed from a direction parallel to the main surfaces of a circuit board, and an illustration of a part of a resin layer is omitted to see the internal structure.

As illustrated in FIG. 30, an inductor component 1i according to the modification in FIG. 30 differs from the inductor component 1h described with reference to FIG. 29 in that a heat-dissipation member 26 is disposed on a first main surface of a substrate 25 instead of the component 22. The other structures are the same as the inductor component 1h in FIG. 29 and are designated by like symbols, and a description thereof is omitted.

The substrate (corresponding to a "substrate that includes a heat-dissipation member disposed on the first main surface" according to the present disclosure) 25 stacked on the upper surface 3a of the resin layer 3 has the first main surface (the surface opposite the surface facing the resin layer 3) and a second main surface (the surface facing the resin layer 3). The heat-dissipation member 26 is disposed on the first main surface. The upper wiring plates 8a and 8b are disposed in an inner layer or a surface layer on the second main surface side. An example of the heat-dissipation member 26 is an aluminum plate.

According to the modification in FIG. 30, the heat dissipation characteristics of the inductor component 1i can be improved by using the heat-dissipation member 26. The heat dissipation can be further improved in a manner in which the heat-dissipation member 26 is brought into contact with a housing of a final product.

Eighth Embodiment

Figure 31:
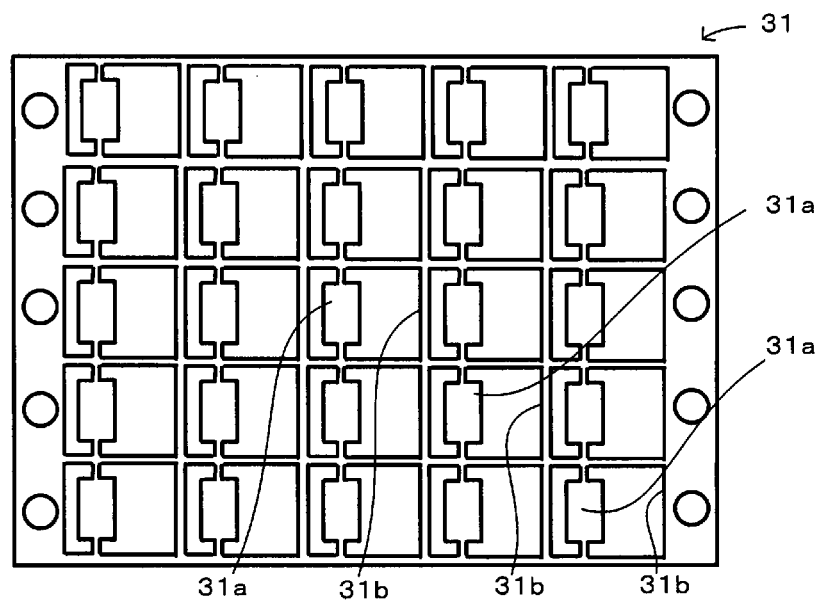
FIG. 31 is a schematic view of a collective upper wiring plate of an inductor component according to an eighth embodiment of the present disclosure.
Figure 32:
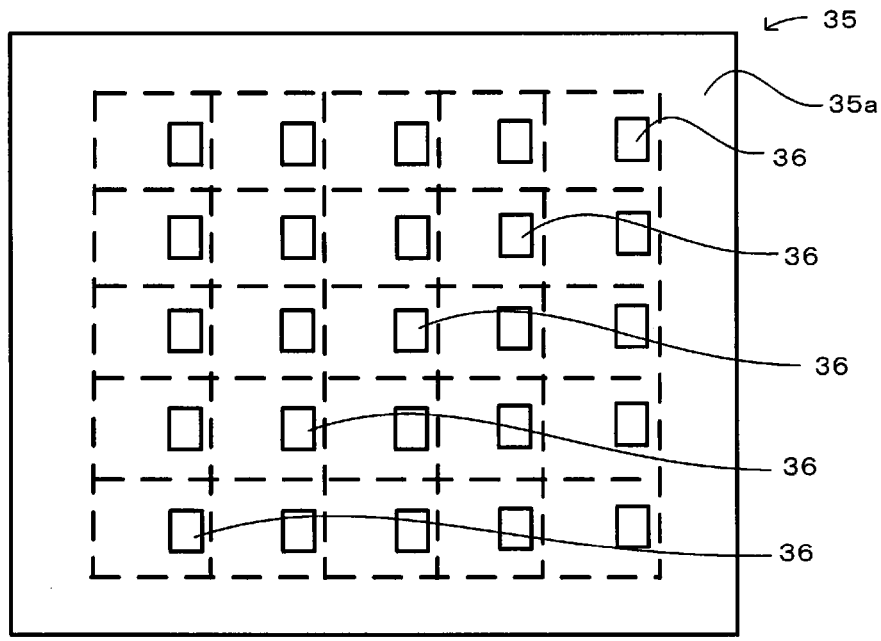
FIG. 32 is a schematic view of a circuit board of the inductor component according to the eighth embodiment of the present disclosure.
Figure 33:
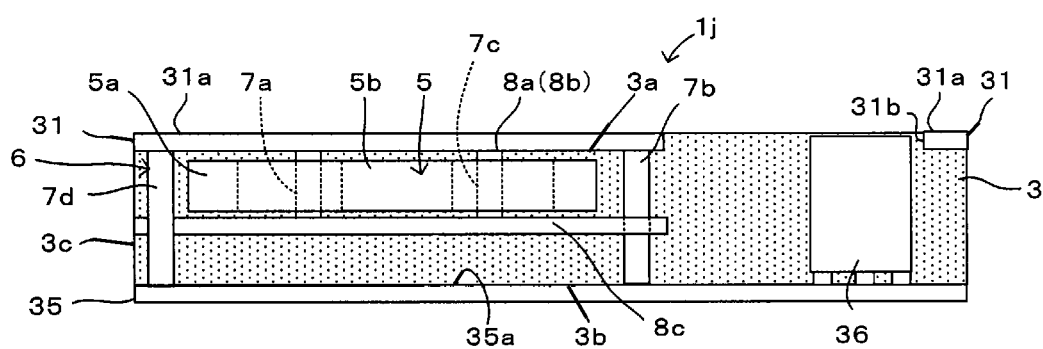
FIG. 33 is a schematic view of the inductor component according to the eighth embodiment of the present disclosure and illustrates the positional relationship between inductor-related components and the other components.
Figure 34:
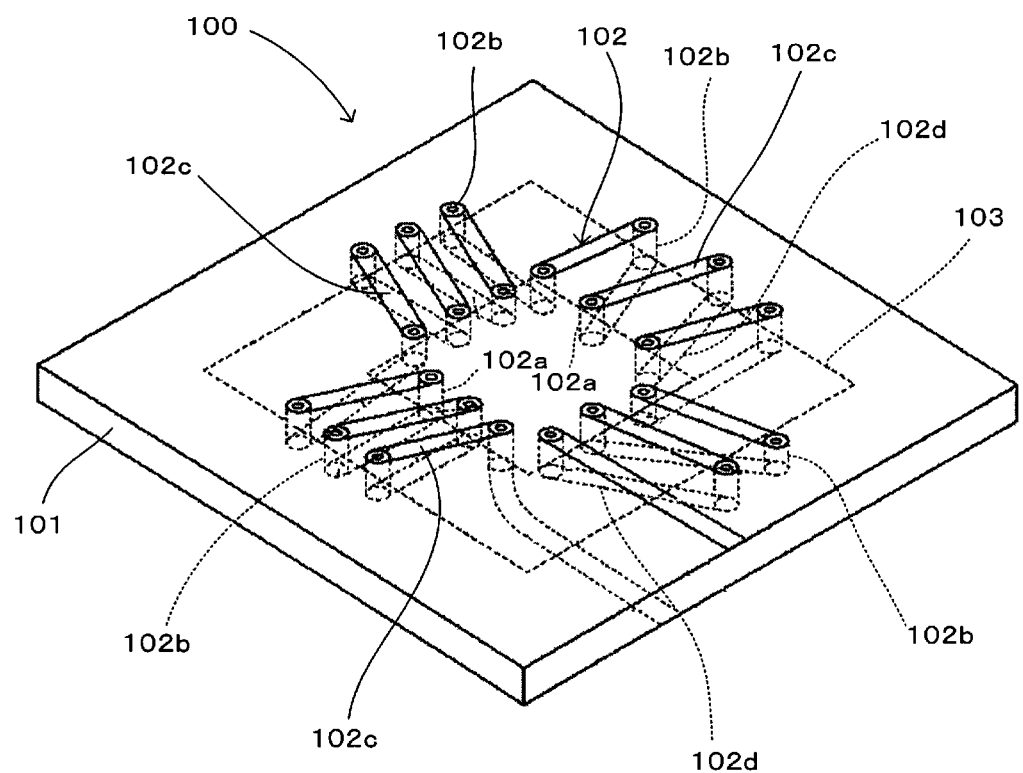
FIG. 34 is a perspective view of an existing inductor component.

An inductor component according to an eighth embodiment of the present disclosure will be described with reference to FIG. 31 to FIG. 33. FIG. 31 is a schematic view of a collective wiring plate (a collective upper wiring plate and a collective lower wiring plate) of the inductor component. FIG. 32 is a schematic view of the circuit board of the inductor component. FIG. 33 is a schematic view of the inductor component and illustrates the positional relationship between inductor-related components and the other components.

As illustrated in FIG. 31 to FIG. 33, an inductor component 1*j* according to the present embodiment differs from the inductor component 1*a* according to the first embodiment described with reference to FIG. 1 and FIGS. 2A to 2D in that a collective upper wiring plate 31 that includes upper wiring plate portions 31*a* including the upper wiring plates 8*a* and 8*b* is provided, insertion holes 31*b* through which components 36 disposed on the upper surface 35*a* of a circuit board 35 are inserted are formed in the collective upper wiring plate 31, and the components 36 are disposed in the regions of the circuit board 35 that correspond to the insertion holes 31*b* when viewed from a direction perpendicular to the upper surface of the inductor component 1*j*. The other structures are the same as the inductor component 1*a* according to the first embodiment and are designated by like symbols, and a description thereof is omitted.

The collective upper wiring plate 31 is made of a conductive material and, as illustrated in FIG. 31, includes the upper wiring plate portions 31*a* in a matrix arrangement. The insertion holes 31*b* are formed in the collective upper wiring plate 31 so as to be adjacent to the upper wiring plate portions 31*a*. The upper wiring plates 8*a* and 8*b* are disposed on the surfaces of the upper wiring plate portions 31*a* facing the coil core 5. The insertion holes 31*b* are holes through which the components 36 mounted on the upper surface 35*a* of the circuit board 35 are inserted.

The upper end surfaces of the metal pins 7*a* to 7*d* are connected at predetermined positions to one surface (the surface opposite the surface facing the collective upper wiring plate 31) of each of the upper wiring plates 8*a* and 8*b*. The coil core 5 is disposed such that the rod-like portion 5*b* is located between the short metal pins 7*a* and 7*c*, and the long metal pins 7*b* and 7*d* are located outside the annular portion 5*a*. The lower end surfaces of the short metal pins 7*a* and 7*c* are connected to one surface of the lower wiring plate 8*c* (the surface facing the coil core 5).

As illustrated in FIG. 32, the components 36 are mounted on the upper surface 35*a* of the circuit board 35 by using a known surface mount technology. Each of the components 36 is composed of, for example, a semiconductor element formed of, for example, Si, a chip capacitor, a chip inductor, or a chip resistance. As illustrated in FIG. 33, the components 36 are disposed in the regions of the collective upper wiring plate 31 that correspond to the insertion holes 31*b* when viewed from a direction perpendicular to the upper surface of the circuit board 35 in a state where the lower wiring plate 8*c*, the coil core 5, the metal pins 7*a* to 7*d*, and the collective upper wiring plate 31 are disposed on the circuit board 35. Each of the components 36 disposed in the regions has a size that enables the component to be inserted through the corresponding insertion hole 31*b* and has, for example, a large height.

As illustrated in FIG. 33, in which a part of the inductor component 1*j* is illustrated, a structure formed of the collective upper wiring plate 31 including the upper wiring plates 8*a* and 8*b*, the coil core 5, the metal pins 7*a* to 7*d*, and the lower wiring plate 8*c* is disposed on the upper surface 35*a* of the circuit board 35 such that the components 36 on the circuit board 35 are inserted through the insertion holes 31*b* of the collective upper wiring plate 31.

According to the present embodiment, similar effects as in the inductor component 1*a* according to the first embodiment can be achieved. The inductor-related components (the coil core 5, the inductor electrode, and the metal pins) and the component 36 having a large height is disposed thereon together.

The present disclosure is not limited to the above embodiments, and various modifications can be made in addition to the above modifications without departing from the spirit of the present disclosure. For example, according to the above embodiments, the inductor electrodes 6 and 60 form the coils. However, it is only necessary for the inductor electrodes 6 and 60 to be used as inductor elements. There may be no coil cores 5 and 50.

The winding number of the inductor electrodes 6 and 60 can be appropriately changed. In this case, the number of the metal pins and the wiring plates is preferably changed in accordance with the number.

An insulating coating film for protecting the upper wiring plates 8*a*, 8*b*, and 80*a* may be disposed on the upper surface 3*a* of the resin layer 3. In this case, the insulating coating film may be, for example, an insulating material such as an epoxy resin or polyimide.

The structures of the inductor components 1*a* to 1*j* according to the above embodiments and the modifications may be combined.

The present disclosure can be widely used for various inductor components that each include an inductor electrode including metal pins and metal plates.

1*a* to 1*j* inductor component
2 circuit board
3 resin layer
4 component
5, 50 coil core
5*a* annular portion
5*b* rod-like portion
6, 60, 61, 62 inductor electrode
7*a*, 7*c*, 70*b*, 70*c* metal pin (first metal pin, third metal pin)
7*b*, 7*d*, 70*a*, 70*d* metal pin (second metal pin)
8*a*, 8*b*, 80*a* upper wiring plate (first metal plate, third metal plate)
8*c*, 80*b* lower wiring plate (second metal plate)
9*a*, 9*b* frame (flat-plate frame)
12*a*, 12*b* bent portion (first bent portion)
12*c*, 12*d* bent portion (second bent portion, third bent portion)
13*a*, 13*b* insertion hole (first insertion hole)
13*c*, 13*d* insertion hole (third insertion hole, fourth insertion hole)
13*e*, 13*g* insertion hole (fifth insertion hole)
13*f*, 13*h* insertion hole (sixth insertion hole)
13*i*, 13*j* insertion hole (second insertion hole)
21 component-mounting substrate
22 component
25 substrate
26 heat-dissipation member

The invention claimed is:
1. An inductor component comprising:
a resin layer; and
an inductor electrode,
wherein the inductor electrode includes a first metal pin and a second metal pin, wherein the first metal pin and the second metal pin extend in the resin layer, and a first end of the first metal pin and a first end of the second metal pin are exposed from one main surface of the resin layer, and a first metal plate disposed on the one main surface of the resin layer and being in contact with the first end of the first metal pin and the first end of the second metal pin, wherein the second metal pin is longer than the first metal pin, wherein the inductor component further comprises:

a circuit board having a main surface in contact with another main surface of the resin layer, and a component mounted on the main surface of the circuit board and sealed in the resin layer, wherein the inductor electrode further includes a second metal plate disposed inside the resin layer and connected to a second end of the first metal pin, and wherein a second end of the second metal pin is exposed from the other main surface of the resin layer and is connected to the circuit board.

2. The inductor component according to claim 1, wherein the second metal plate includes a first bent portion provided such that a portion of the second metal plate is bent in a direction perpendicular to the one main surface of the resin layer, and a first insertion hole through which the second end of the first metal pin is inserted is provided in the second metal plate by the first bent portion.

3. The inductor component according to claim 1, wherein the first metal pin includes a second end portion including the second end of the first metal pin and being thinner than the other portion of the first metal pin, and wherein the second end portion of the first metal pin is inserted through a second insertion hole provided in the second metal plate, wherein the second insertion hole is smaller than the other portion of the first metal pin, and is larger than the second end portion.

4. The inductor component according to claim 1, wherein the inductor electrode further includes a third metal pin being shorter than the second metal pin and extending in the resin layer, wherein a first end of the third metal pin is exposed from the one main surface of the resin layer, and a third metal plate disposed on the one main surface of the resin layer and connected to the first end of the third metal pin, and wherein the second metal plate connects the second end of the first metal pin and a second end of the third metal pin to each other such that the inductor electrode provides a coil having a winding axis in a direction substantially parallel to the one main surface of the resin layer.

5. The inductor component according to claim 1, wherein at least an end of the first metal plate reaches an edge portion of the resin layer when viewed from a direction perpendicular to the one main surface of the resin layer.

6. The inductor component according to claim 4 further comprising: a coil core disposed between the first metal pin and the third metal pin and between the first metal plate and the second metal plate.

7. The inductor component according to claim 6, wherein the coil core has a shape obtained from a combination of an annular portion and a rod portion disposed such that the rod portion halves an inner region of the annular portion when viewed from a direction perpendicular to the one main surface of the resin layer, and wherein the rod portion is disposed between the first metal pin and the third metal pin such that an axial direction of the rod portion is substantially parallel to the winding axis of the coil.

8. The inductor component according to claim 4, wherein both ends of the first metal plate reach edge portions of the resin layer when viewed from a direction perpendicular to the one main surface of the resin layer, and wherein a portion of the first metal plate located between a contact point with the first metal pin and a contact point with the third metal pin has a width larger than a width of the other portion of the first metal plate.

9. The inductor component according to claim 1, wherein the first metal plate includes a second bent portion provided such that a portion of the first metal plate is bent in a direction perpendicular to the one main surface of the resin layer, and a third bent portion provided such that another portion of the first metal plate is bent in the direction perpendicular to the one main surface of the resin layer, and wherein a third insertion hole through which the first end of the first metal pin is inserted is provided in the first metal plate at the second bent portion, and a fourth insertion hole through which the first end of the second metal pin is inserted is provided in the first metal plate at the third bent portion.

10. The inductor component according to claim 1, wherein a fifth insertion hole through which the first metal pin is inserted and a sixth insertion hole through which the second metal pin is inserted are provided in the first metal plate, wherein the first metal pin includes a first end portion including the first end of the first metal pin and having a flange shape larger than the fifth insertion hole so that the first end portion engages the first metal plate, and wherein the second metal pin includes a first end portion including the first end of the second metal pin and having a flange shape larger than the sixth insertion hole so that the first end portion engages the first metal plate.

11. The inductor component according to claim 1, wherein the first metal plate is a lead frame.

12. The inductor component according to claim 1 further comprising:

a substrate having a first main surface and a second main surface and including a component disposed on the first main surface, wherein the first metal plate is disposed on the substrate.

13. The inductor component according to claim 1, further comprising:

a substrate having a first main surface and a second main surface and including a heat-dissipation member disposed on the first main surface, wherein the first metal plate is disposed on the substrate.

14. A method for manufacturing the inductor component according to claim 1, comprising:

a step of connecting a first end of a first metal pin and a first end of a second metal pin longer than the first metal pin to a surface of a first metal plate supported by a flat-plate frame to form a first structure including the metal pins having different lengths disposed on the surface of the first metal plate;

a step of connecting a surface of a second metal plate supported by a flat-plate frame to a second end of the first metal pin to form a second structure having an inductor electrode including the first metal plate, the second metal plate, the first metal pin, and the second metal pin;

a step of connecting a second end of the second metal pin to a main surface of a circuit board including a component mounted on the main surface to form a third structure having the component disposed between the main surface of the circuit board and the second metal plate;

a step of filling a space between the first metal plate and the main surface of the circuit board with a resin to form a fourth structure including the third structure and a resin layer; and a step of processing the fourth structure such that the flat-plate frame of the first metal plate and the flat-plate frame of the second metal plate are removed.

15. The method according to claim 14 for manufacturing the inductor component, wherein each of the first metal plate and the second metal plate has an insertion hole through which the component is inserted.

16. The inductor component according to claim 2, wherein the inductor electrode further includes a third metal pin being shorter than the second metal pin and extending in the resin layer, wherein a first end of the third metal pin is exposed from the one main surface of the resin layer, and a third metal plate disposed on the one main surface of the resin layer and connected to the first end of the third metal pin, and wherein the second metal plate connects the second end of the first metal pin and a second end of the third metal pin to each other such that the inductor electrode provides a coil having a winding axis in a direction substantially parallel to the one main surface of the resin layer.

17. The inductor component according to claim 3, wherein the inductor electrode further includes a third metal pin being shorter than the second metal pin and extending in the resin layer, wherein a first end of the third metal pin is exposed from the one main surface of the resin layer, and a third metal plate disposed on the one main surface of the resin layer and connected to the first end of the third metal pin, and wherein the second metal plate connects the second end of the first metal pin and a second end of the third metal pin to each other such that the inductor electrode provides a coil having a winding axis in a direction substantially parallel to the one main surface of the resin layer.

18. The inductor component according to claim 2, wherein at least an end of the first metal plate reaches an edge portion of the resin layer when viewed from a direction perpendicular to the one main surface of the resin layer.

* * * * *

UNITED STATES PATENT AND TRADEMARK OFFICE
CERTIFICATE OF CORRECTION

PATENT NO.         : 10,672,554 B2
APPLICATION NO.    : 16/046092
DATED              : June 2, 2020
INVENTOR(S)        : Norio Sakai Page 1 of 1

It is certified that error appears in the above-identified patent and that said Letters Patent is hereby corrected as shown below:

In the Specification

Column 16, Line 27, "component if are the same" should read -- component 1f are the same --

Column 17, Line 10, "component if according to" should read -- component 1f according to --

Column 17, Line 12, "component if include two" should read -- component 1f include two --

Column 17, Line 16, "component if to be" should read -- component 1f to be --

Signed and Sealed this
First Day of December, 2020

Andrei Iancu
*Director of the United States Patent and Trademark Office*